(12) United States Patent
Yamamoto

(10) Patent No.: US 9,955,592 B2
(45) Date of Patent: Apr. 24, 2018

(54) DISPLAY DEVICE

(71) Applicant: Saturn Licensing LLC, New York, NY (US)

(72) Inventor: Takeshi Yamamoto, Tokyo (JP)

(73) Assignee: Saturn Licensing LLC, New York, NY (US)

( * ) Notice: Subject to any disclaimer, the term of this patent is extended or adjusted under 35 U.S.C. 154(b) by 300 days.

(21) Appl. No.: 14/437,093

(22) PCT Filed: Oct. 21, 2013

(86) PCT No.: PCT/JP2013/078445
§ 371 (c)(1),
(2) Date: Apr. 20, 2015

(87) PCT Pub. No.: WO2014/069267
PCT Pub. Date: May 8, 2014

(65) Prior Publication Data
US 2015/0282334 A1    Oct. 1, 2015

(30) Foreign Application Priority Data
Oct. 29, 2012  (JP) .................................. 2012-237863

(51) Int. Cl.
*G02F 1/1333*    (2006.01)
*H05K 5/00*      (2006.01)
(Continued)

(52) U.S. Cl.
CPC ........... *H05K 5/0004* (2013.01); *F21V 29/70* (2015.01); *G02F 1/133308* (2013.01);
(Continued)

(58) Field of Classification Search
CPC ............... G02F 1/133308; G02F 2001/133317
(Continued)

(56) References Cited

U.S. PATENT DOCUMENTS 7,120,010 B2   10/2006 Tajima
8,023,064 B2    9/2011 Ono
(Continued)

FOREIGN PATENT DOCUMENTS

CN    1480912 A    3/2004
CN    1641445 A    7/2005
(Continued)

OTHER PUBLICATIONS

Chinese Office Action for Application No. CN2001380055255.1 dated Dec. 5, 2016.
(Continued)

*Primary Examiner* — Thanh-Nhan P Nguyen
(74) *Attorney, Agent, or Firm* — Lerner, David, Littenberg, Krumholz & Mentlik, LLP

(57) ABSTRACT

Included are: a display that is configured to allow an image to be displayed on a display screen; a back chassis disposed on an opposite surface side to the display screen of the display; and a support body disposed on a peripheral side of the display and the back chassis. The support body includes a plate section, a first link section, and a second link section, the plate section being directed in a direction perpendicular to the display, the first link section being provided on one surface in a direction of thickness of the plate section, and the second link section being provided on the one surface in the direction of thickness of the plate section. A first member is attached to a periphery of the opposite surface to the display screen of the display, the first member being linked to the first link section, and a second member is attached to a periphery of the back chassis, the second member being linked to the second link section.

24 Claims, 20 Drawing Sheets

(51) Int. Cl.
 F21V 29/70    (2015.01)
 H05K 5/04     (2006.01)
 H05K 7/20     (2006.01)
 G06F 1/16     (2006.01)
 F16B 5/07     (2006.01)
 F16B 21/09    (2006.01)
 H05K 5/02     (2006.01)
 F16B 1/00     (2006.01)
 H04N 5/645    (2006.01)

(52) U.S. Cl.
 CPC ......... G06F 1/1601 (2013.01); H05K 5/0017 (2013.01); H05K 5/04 (2013.01); H05K 7/2039 (2013.01); F16B 5/07 (2013.01); F16B 21/09 (2013.01); F16B 2001/0035 (2013.01); G02F 2001/133314 (2013.01); G02F 2001/133317 (2013.01); G02F 2001/133325 (2013.01); G02F 2001/133328 (2013.01); G02F 2201/46 (2013.01); H04N 5/645 (2013.01); H05K 5/0013 (2013.01); H05K 5/0208 (2013.01)

(58) Field of Classification Search
 USPC ........................................... 349/58
 See application file for complete search history.

(56) References Cited

U.S. PATENT DOCUMENTS

| | | |
|---|---|---|
| 2004/0041748 A1 | 3/2004 | Tanaka et al. |
| 2005/0110918 A1* | 5/2005 | Izawa ................. G07F 17/3211 349/58 |
| 2005/0151894 A1 | 7/2005 | Katsuda et al. |
| 2006/0227498 A1 | 10/2006 | Tanaka et al. |
| 2007/0242476 A1* | 10/2007 | Ida ..................... G02B 6/0088 362/611 |
| 2010/0073582 A1 | 3/2010 | Konno et al. |
| 2011/0222218 A1 | 9/2011 | Kim et al. |
| 2011/0261283 A1 | 10/2011 | Kim et al. |
| 2013/0003339 A1* | 1/2013 | Chen ..................... A47B 81/06 361/807 |

FOREIGN PATENT DOCUMENTS

| | | |
|---|---|---|
| CN | 101051152 A | 10/2007 |
| CN | 202067045 U | 12/2011 |
| CN | 102393578 A | 3/2012 |
| JP | 53-074896 A | 7/1978 |
| JP | 200322030 A | 1/2003 |
| JP | 2003-255851 A | 9/2003 |
| JP | 2005209868 A | 8/2005 |
| JP | 2007-256518 A | 10/2007 |
| JP | 2007-279537 A | 10/2007 |
| JP | 2007-334244 A | 12/2007 |
| JP | 2008-076918 A | 4/2008 |
| JP | 2009175444 A | 8/2009 |
| JP | 201073506 A | 4/2010 |
| JP | 201254108 A | 3/2012 |
| KR | 1020050081359 A | 8/2005 |
| WO | 2012014601 A1 | 2/2012 |

OTHER PUBLICATIONS

Extended European Search Report for Application No. 13851695.0 dated Jun. 3, 2016.
Chinese Office Action for Application No. 2013800552551 dated Aug. 14, 2017, 8 pages.
Japanese Office Action from Application No. JP2014-544437, dated Sep. 5, 2017.
International Search Report from International Publication PCT/JP2013/078445 dated Jan. 21, 2014.

* cited by examiner

[FIG. 1]
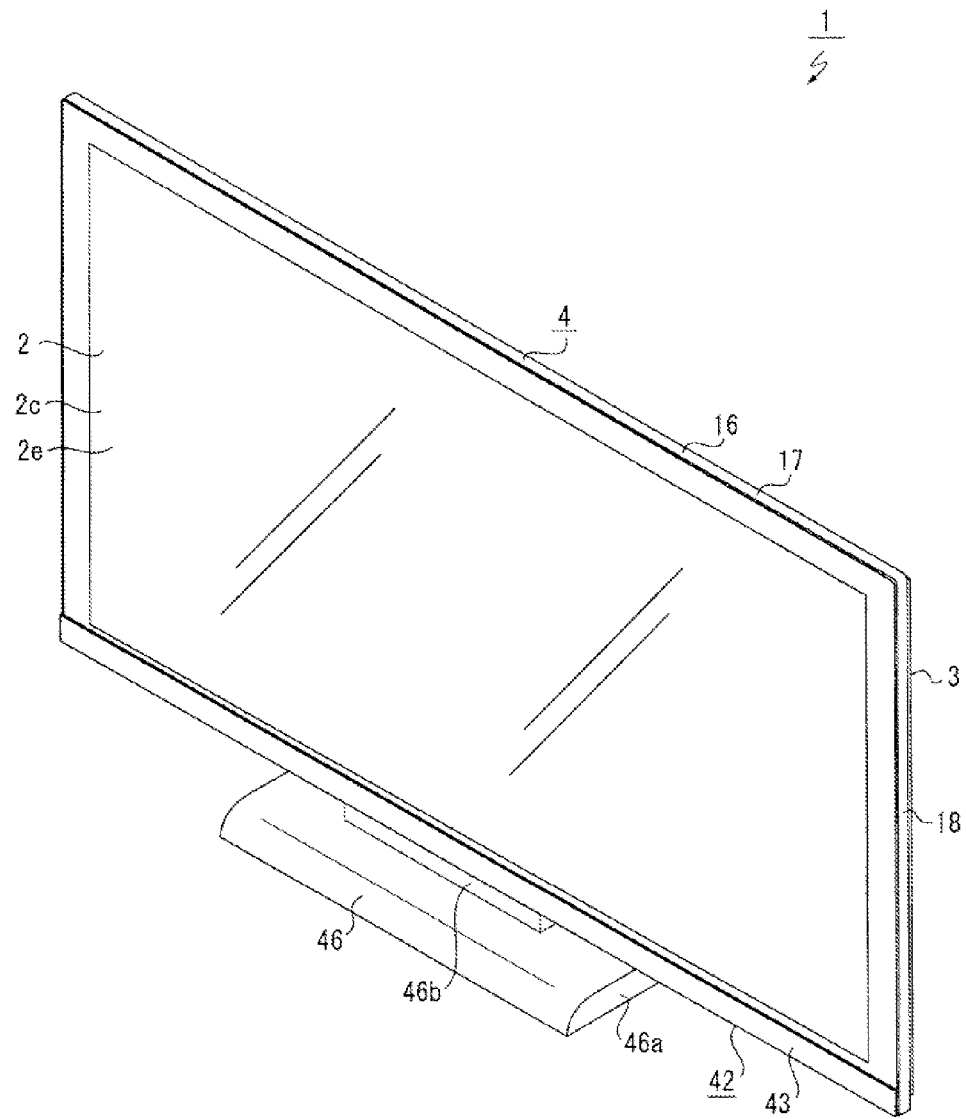

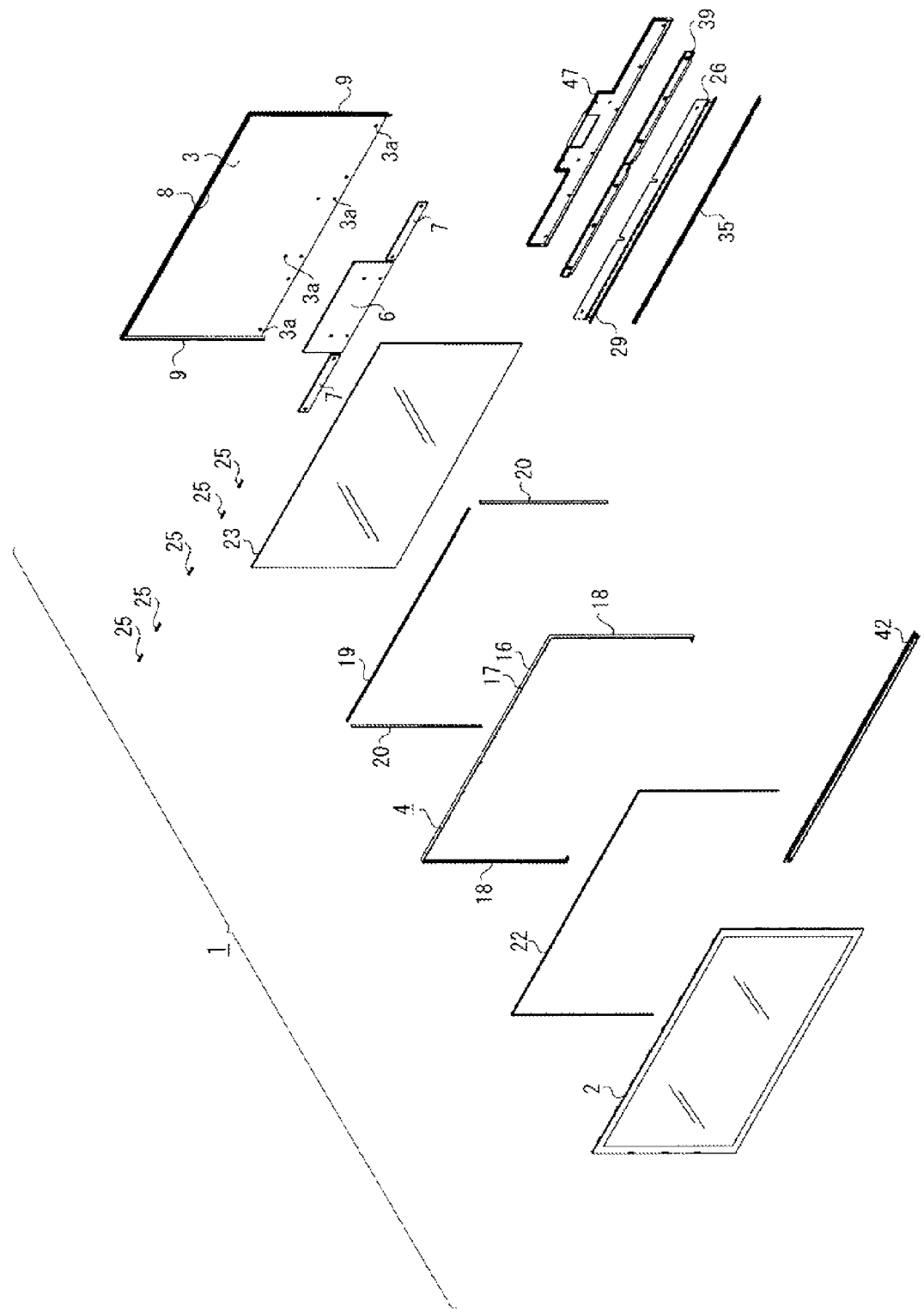
[FIG. 2]

[FIG. 3]
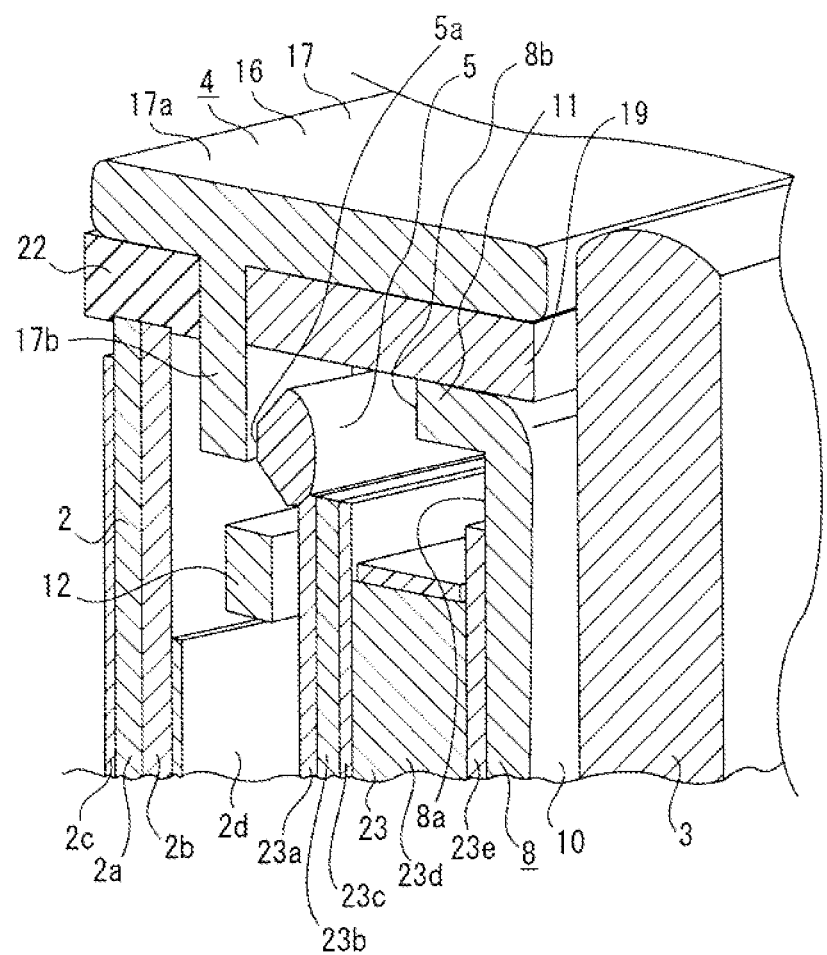

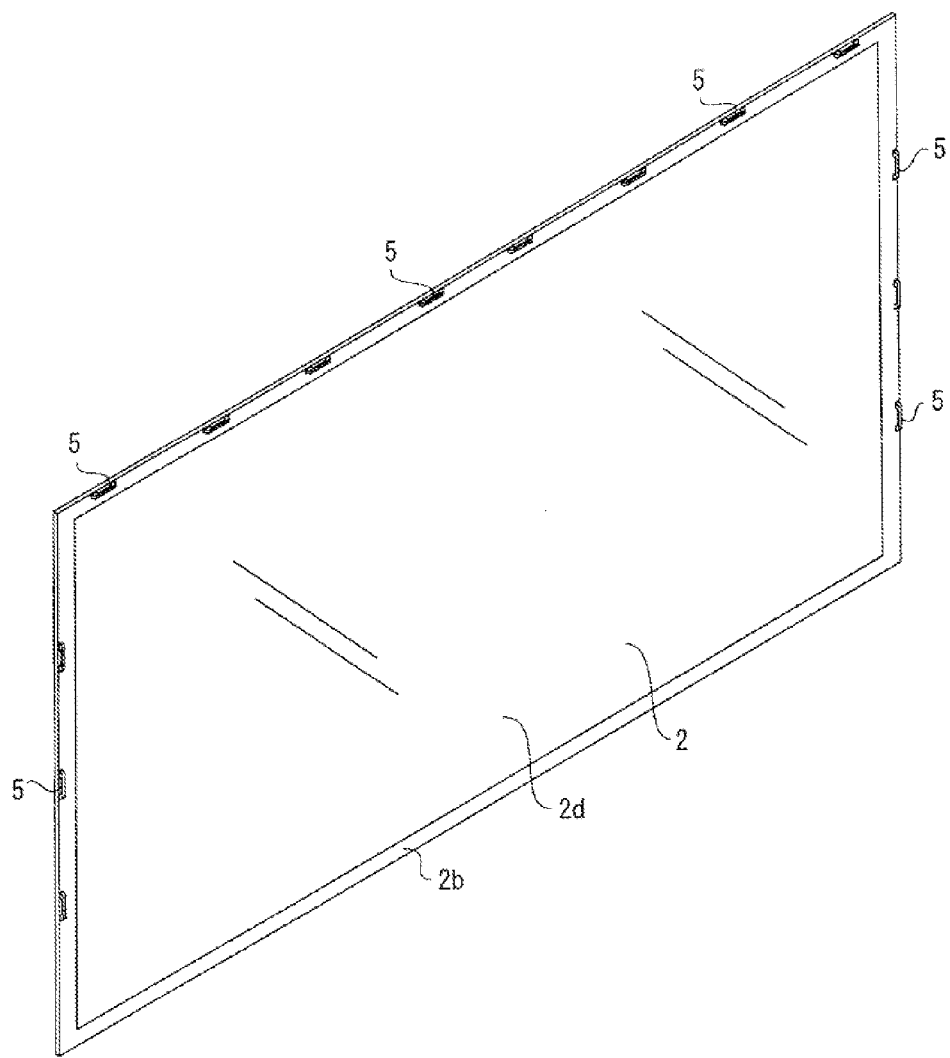
[FIG. 4]

[ FIG. 5 ]
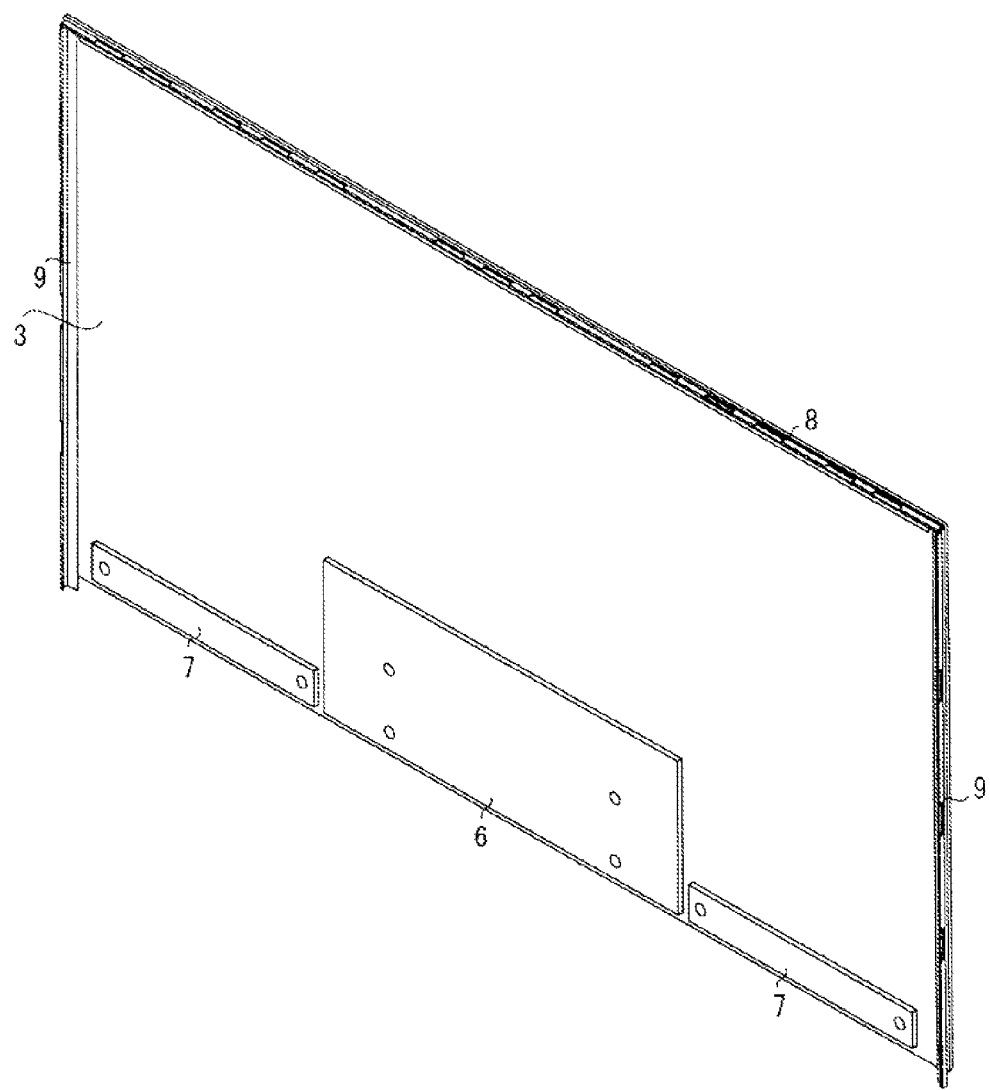

[ FIG. 6 ]
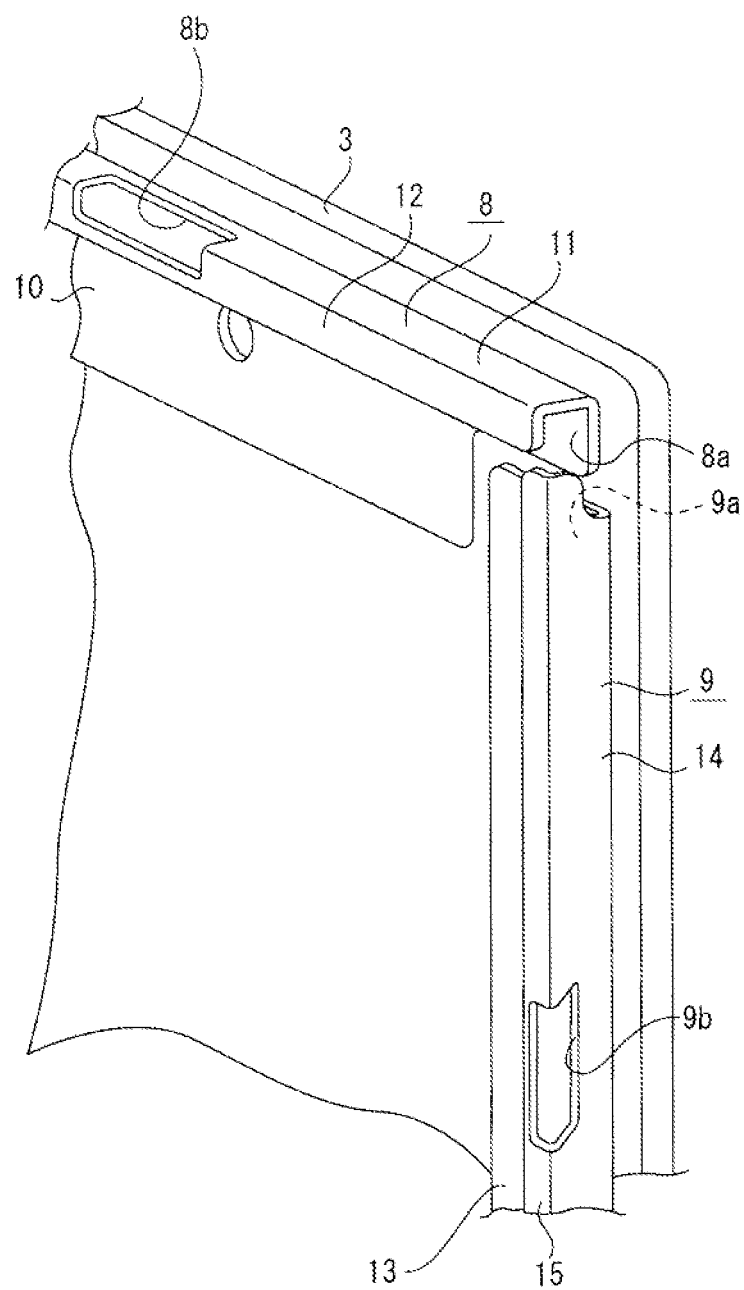

[FIG. 7]
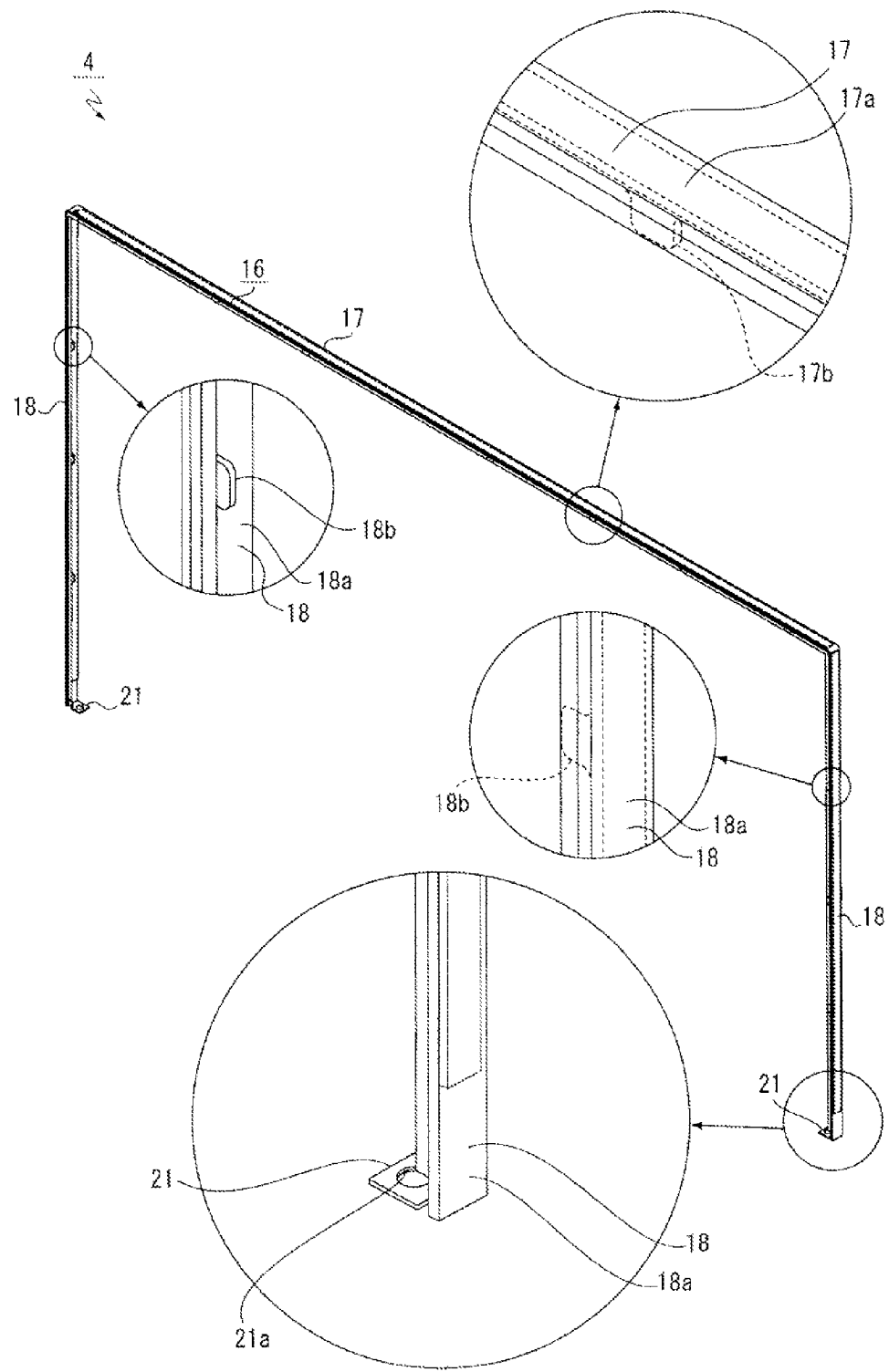

[ FIG. 8 ]
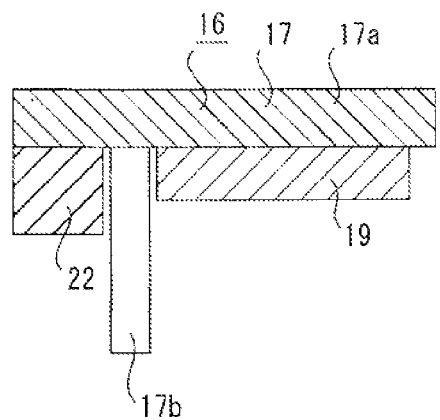
[ FIG. 9A ]
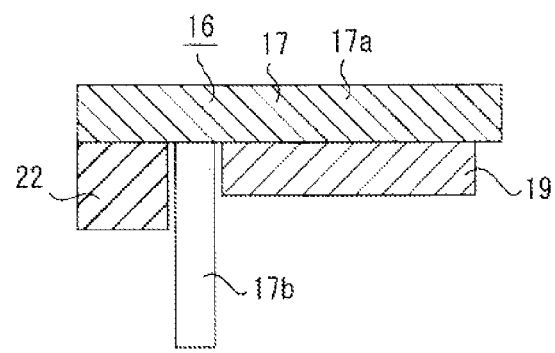
[ FIG. 9B ]
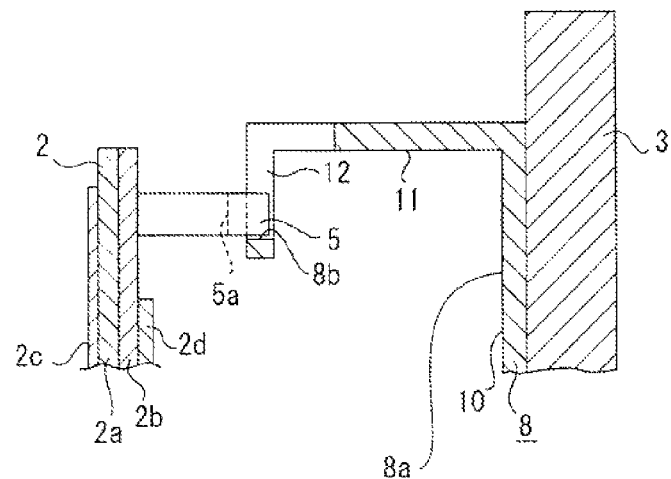

[ FIG. 10 ]
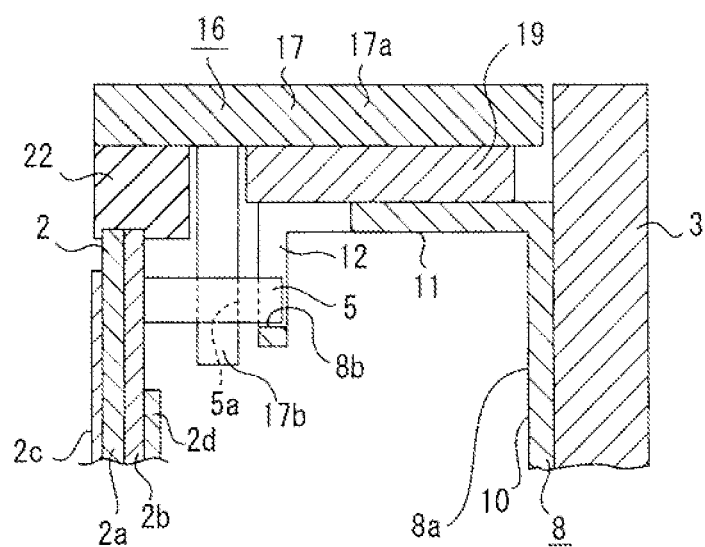

[FIG. 11]
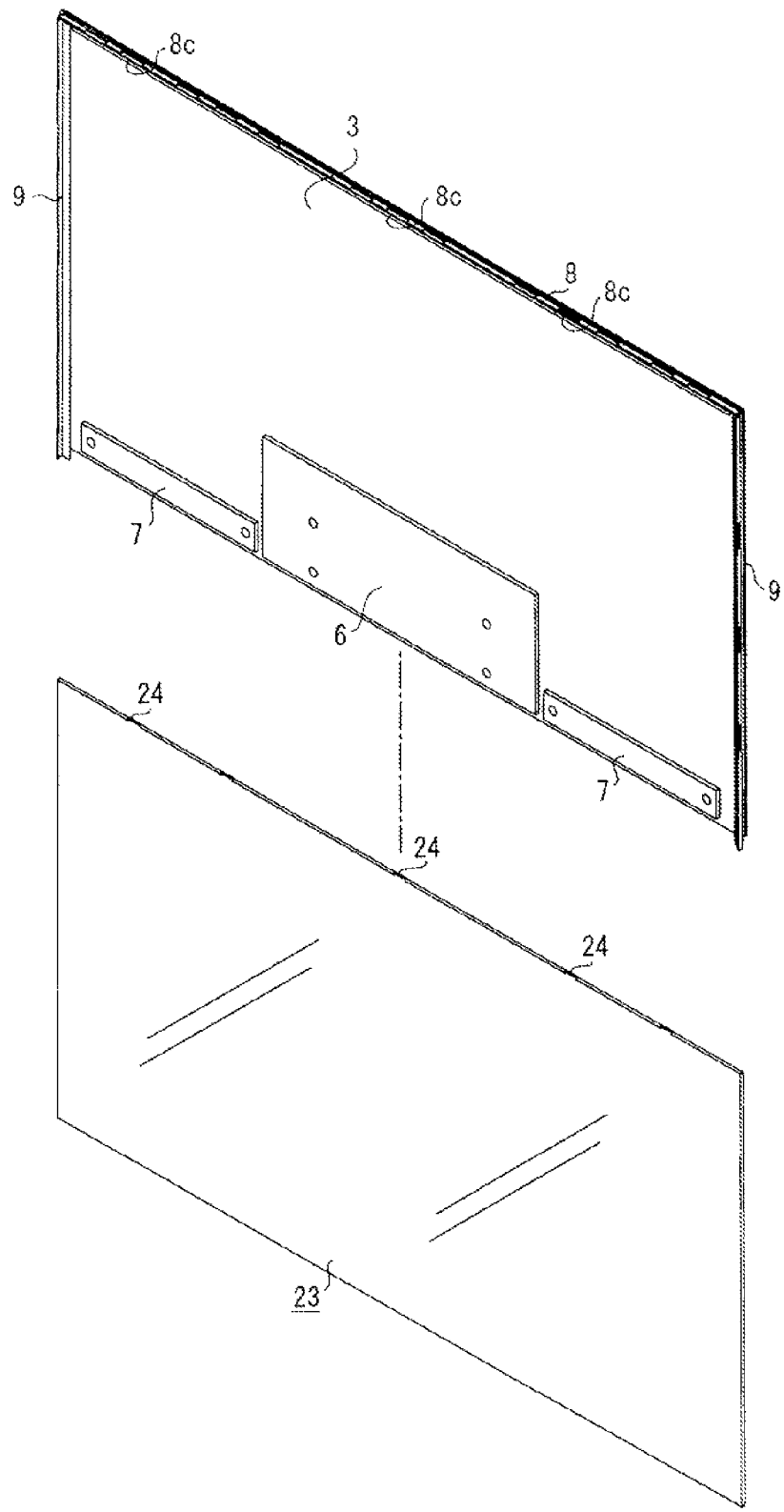

[ FIG. 12 ]
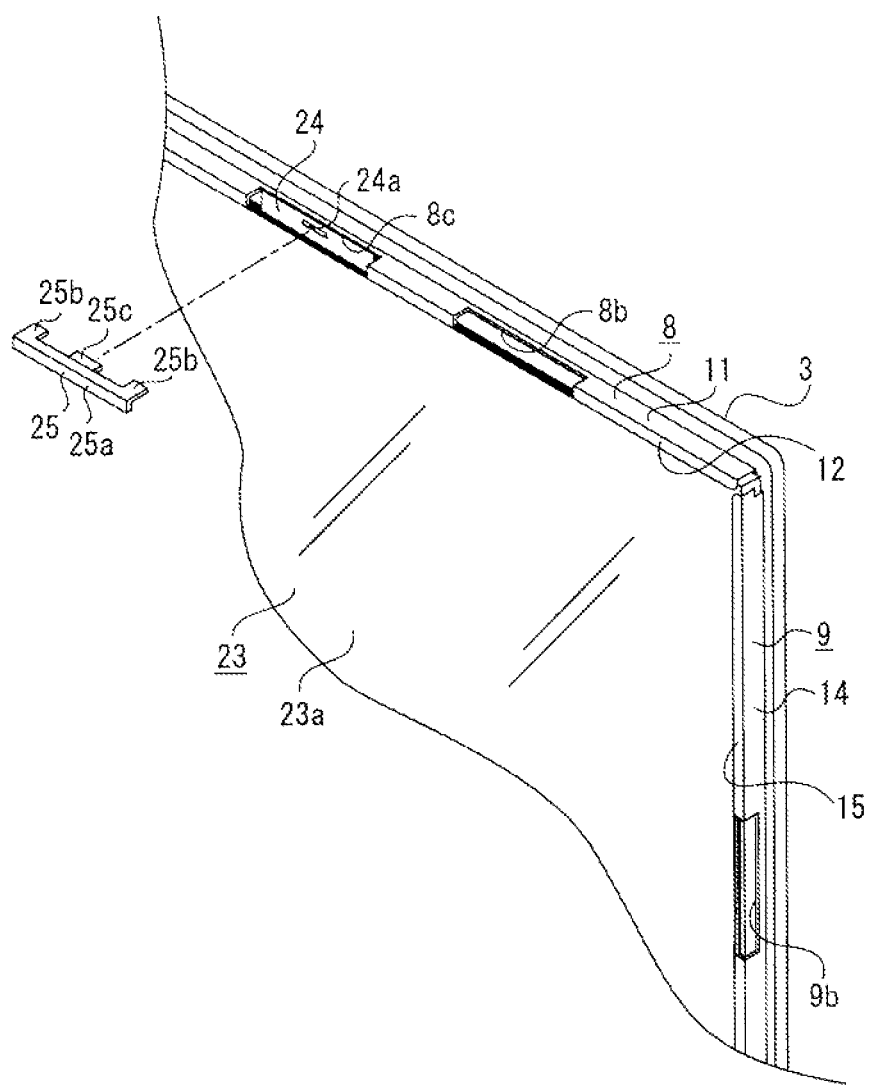

[ FIG. 13 ]
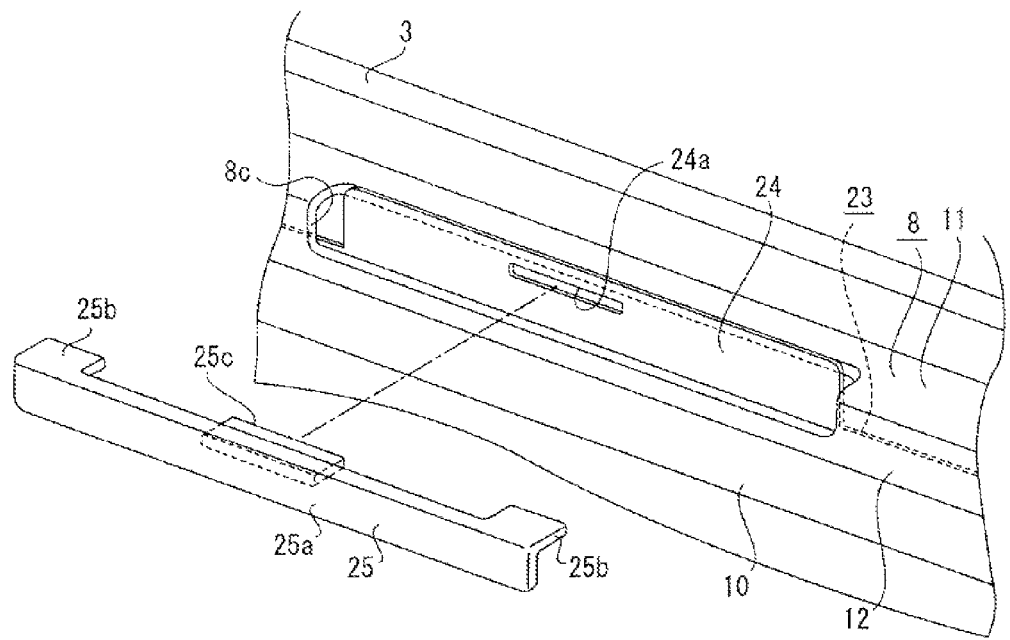
[ FIG. 14 ]
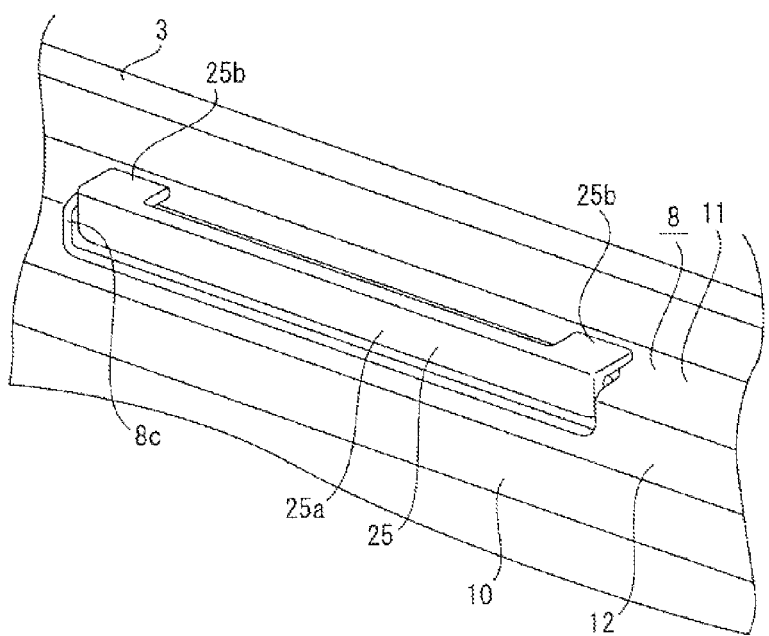

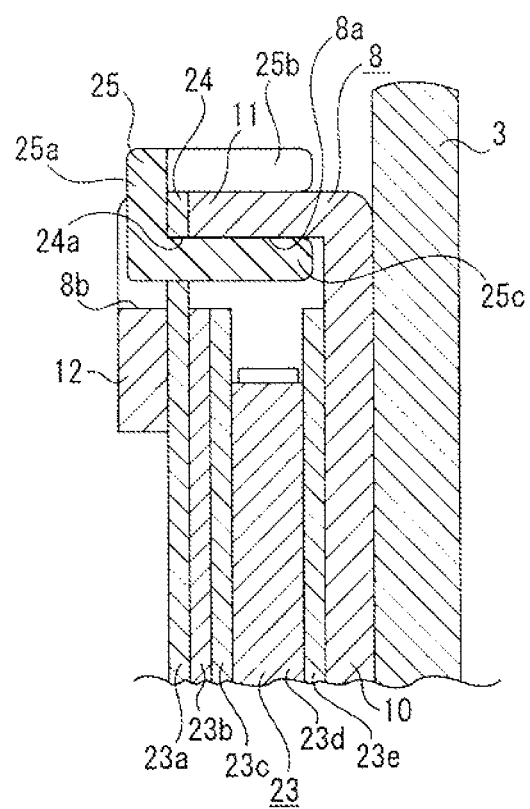
[ FIG. 15 ]

[ FIG. 16 ]
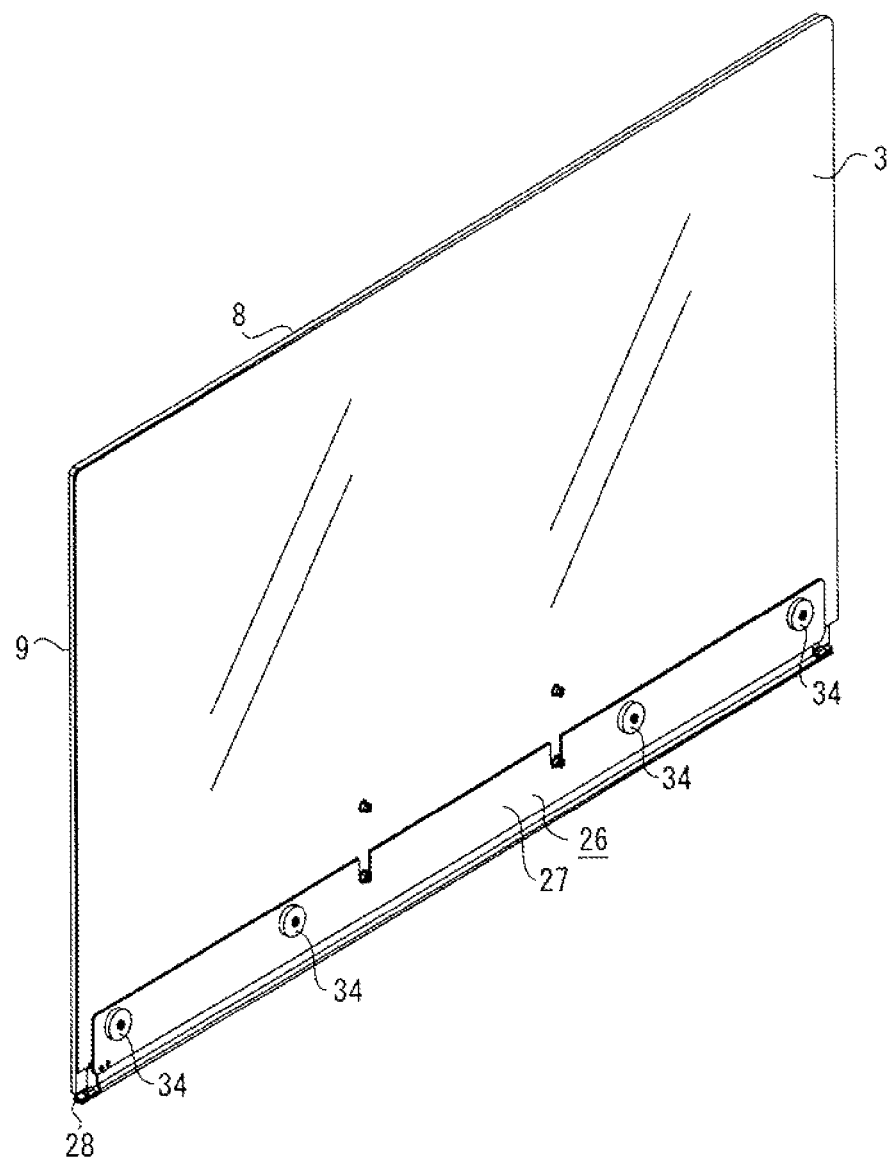

[ FIG. 17 ]
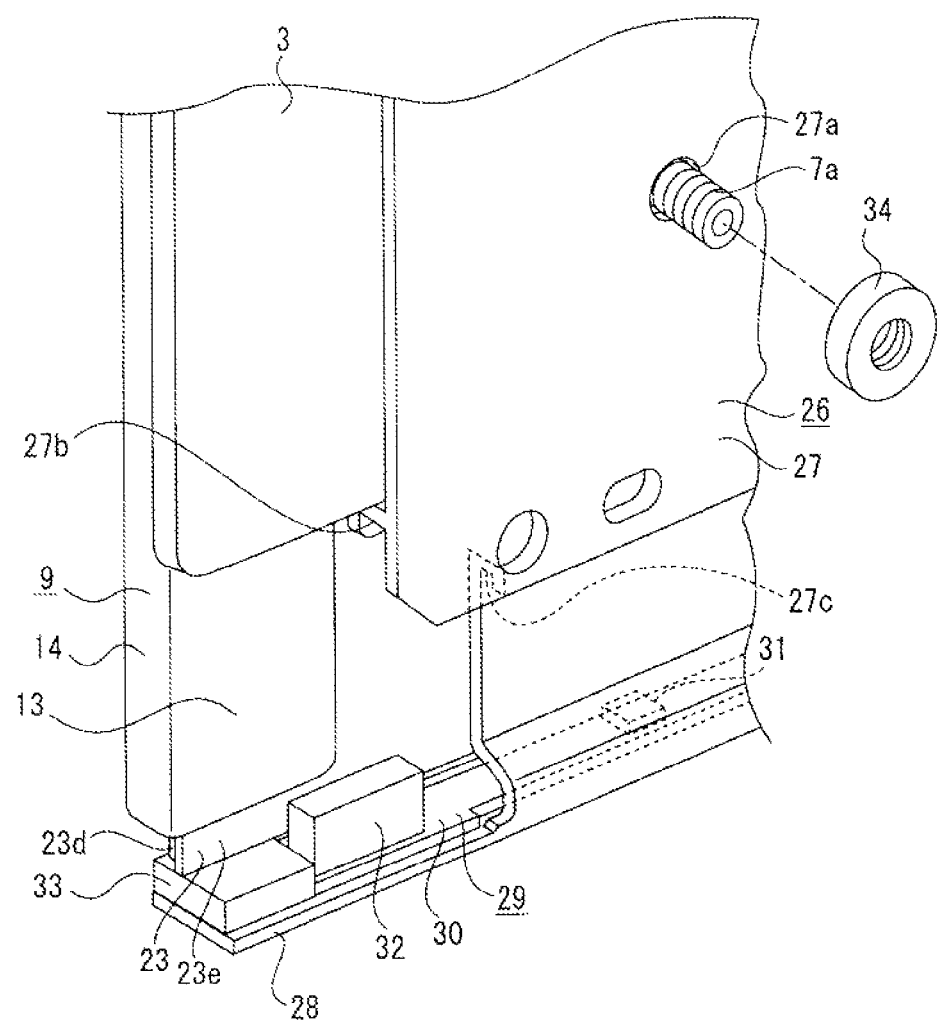

[ FIG. 18A ]
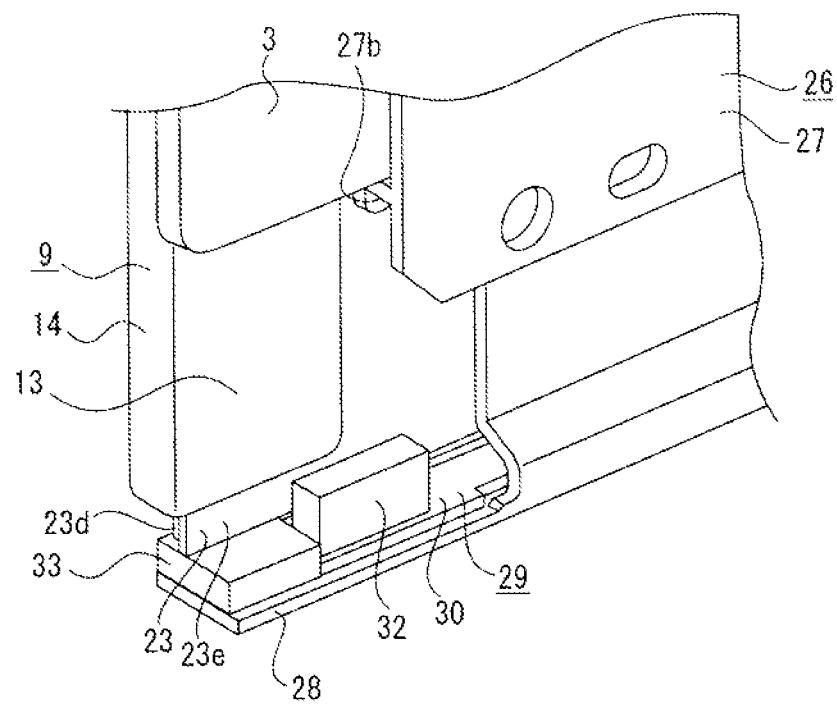
[ FIG. 18B ]
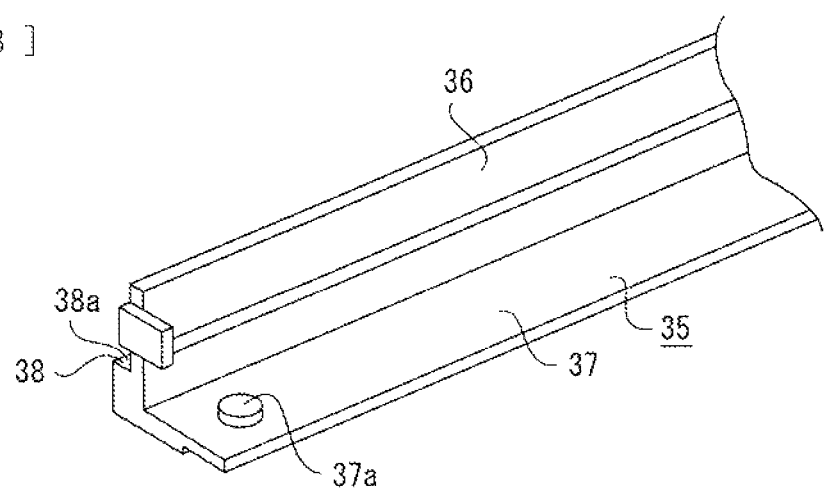

[ FIG. 19 ]
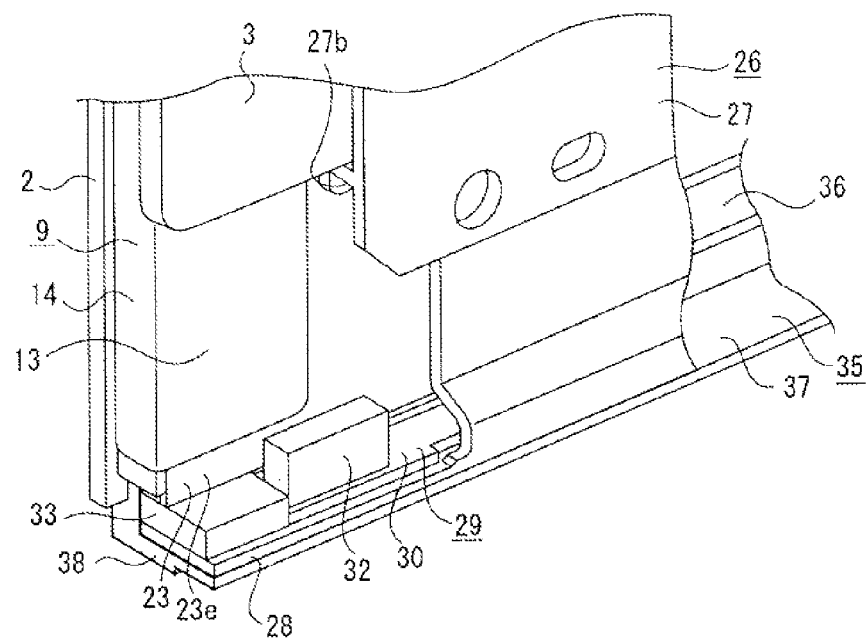
[ FIG. 20 ]
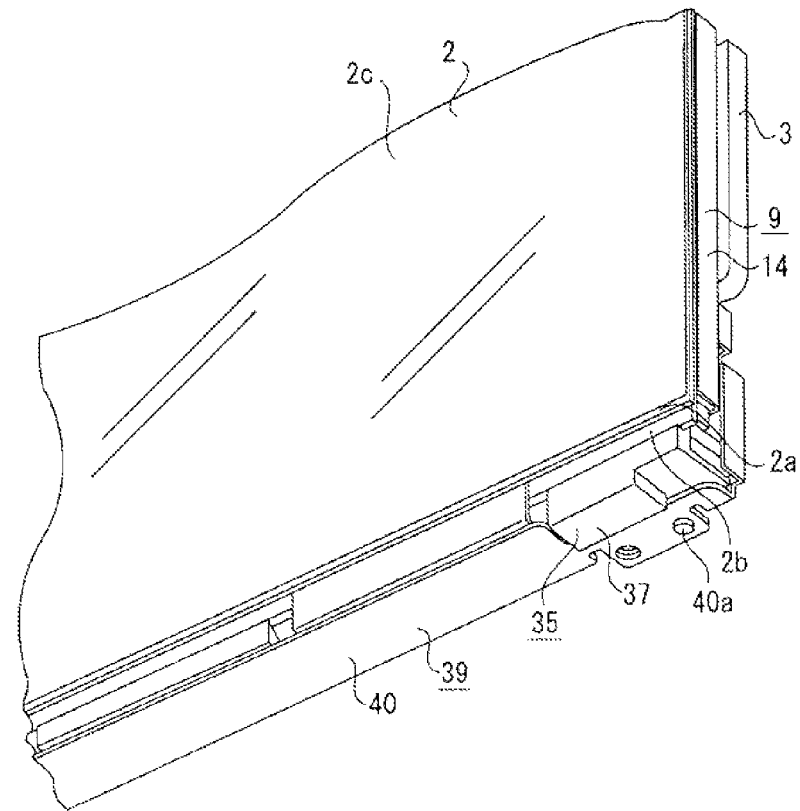

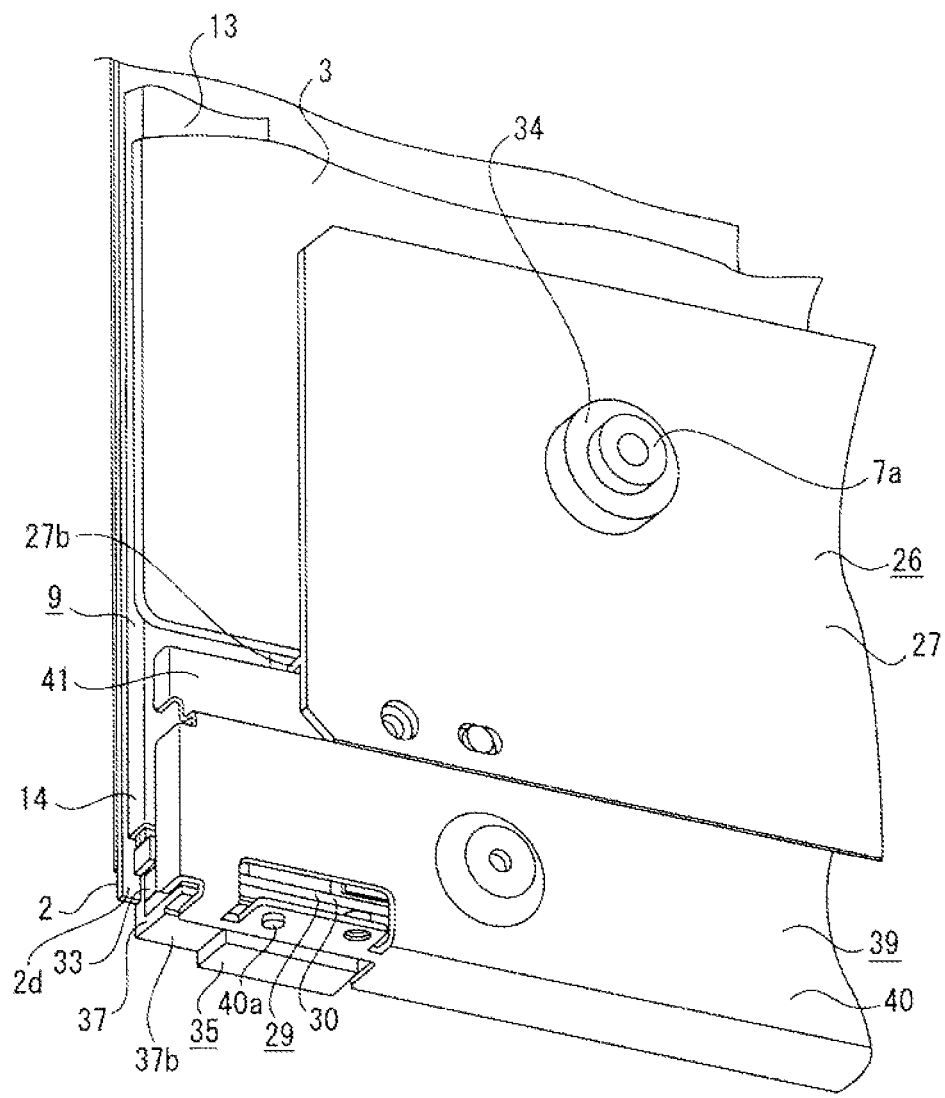
[ FIG. 21 ]

[FIG. 22]
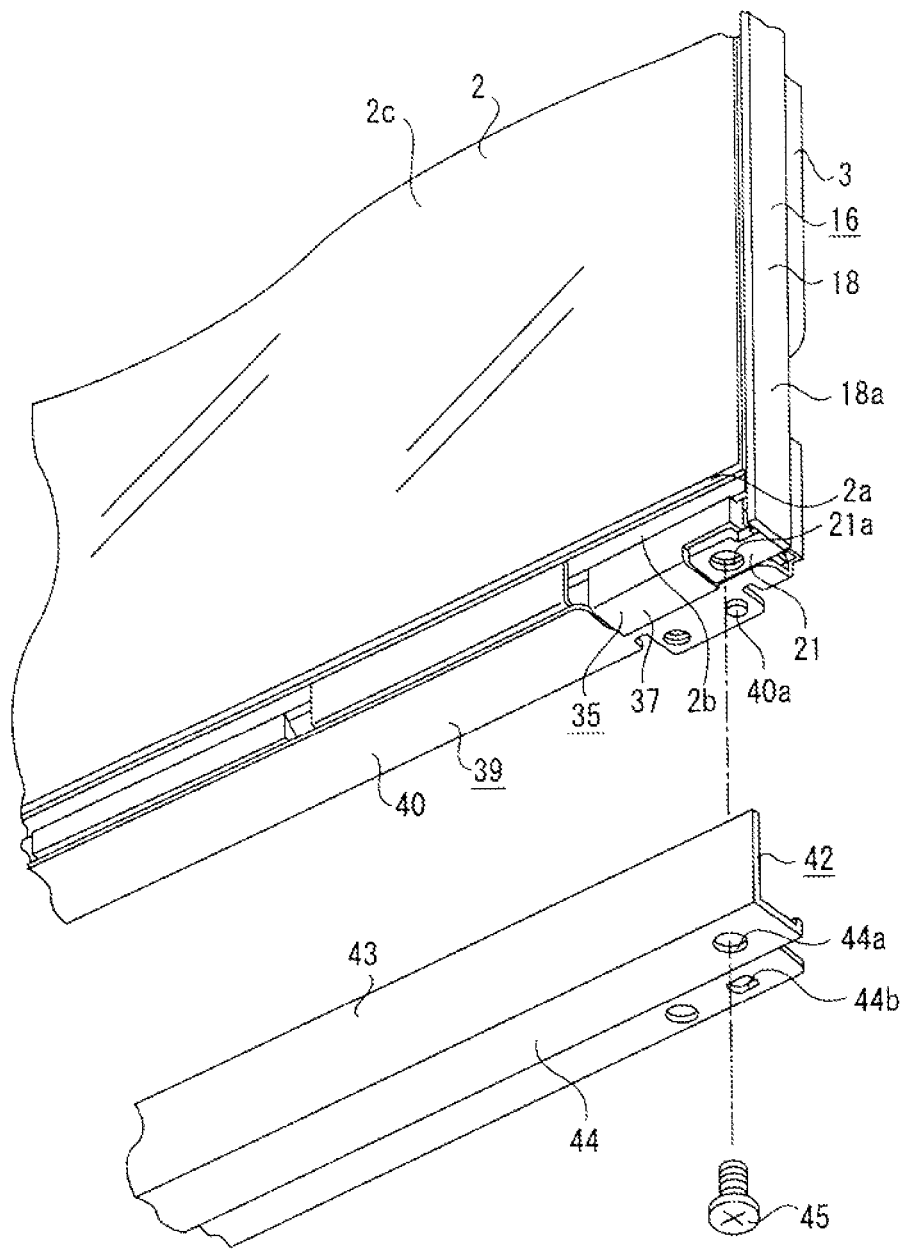

[ FIG. 23 ]
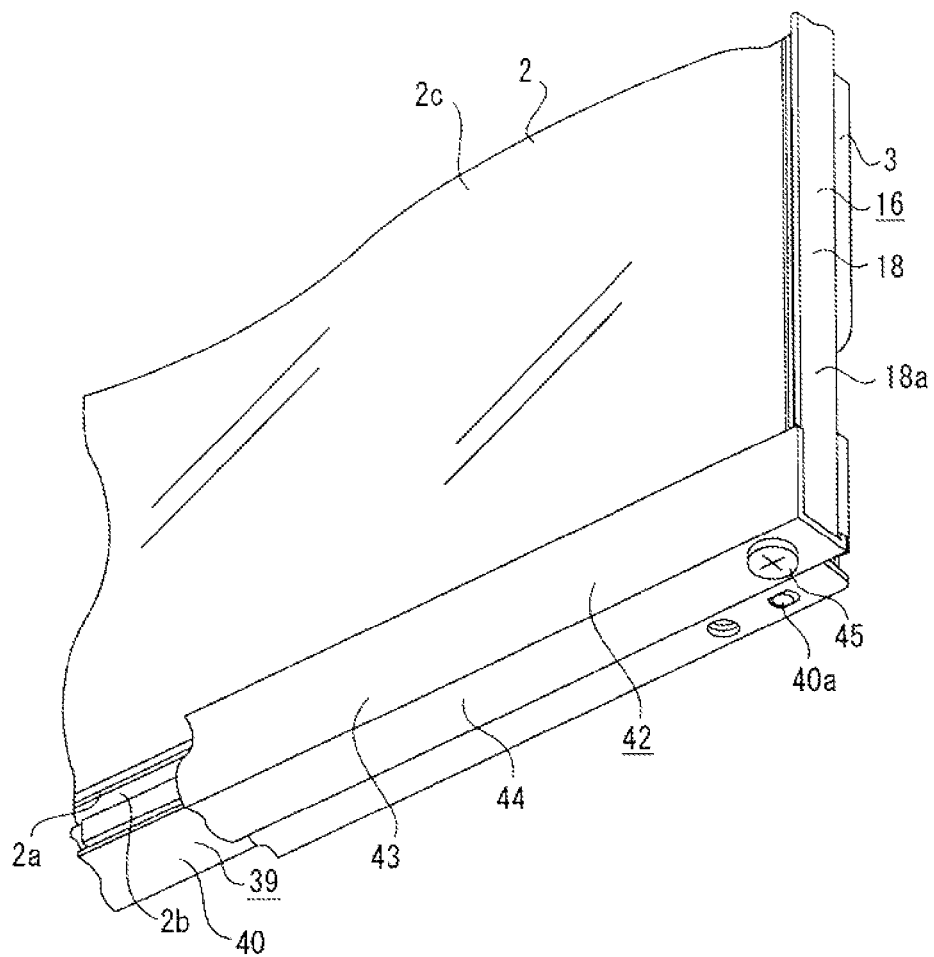

DISPLAY DEVICE

CROSS-REFERENCE TO RELATED APPLICATION

The present application is a national phase entry under 35 U.S.C. § 371 of International Application No. PCT/JP2013/078445 filed Oct. 21, 2013, published on May 8, 2014 as WO 2014/069267 A1, which claims priority from Japanese Patent Application No. JP 2012-237863 filed in the Japanese Patent Office on Oct. 29, 2012.

TECHNICAL FIELD

The present technology relates to a technical field concerning a display device. Specifically, it relates to a technical field concerning a thin display device including a display and a back chassis.

CITATION LIST

Patent Literature

Patent Literature 1: JP 2007-334244A

BACKGROUND ART

For a display device of a television receiver, a personal computer, or the like, there has been one that is provided with a display having a display screen on which an image is displayed; on a back surface side of the display, a back chassis is disposed; and the display is attached to a frame-shaped bezel (for example, refer to Patent Literature 1).

The display device described in Patent Literature 1 is configured as follows: the bezel that supports the display from its peripheral side is formed in a shape of a plate that is directed in a front-rear direction; the display is attached to a rear surface of the bezel; and the back chassis is disposed on a rear surface of the display.

SUMMARY OF INVENTION

However, in the display device described in Patent Literature 1, since the frame-shaped bezel is formed in the shape of the plate that is directed in the front-rear direction, there is a problem of a large outer shape, which hinders reduction in size.

Moreover, since the display is attached on the rear surface side of the bezel, a thickness in the front-rear direction becomes large for that, which causes another problem of failing in sufficient reduction in thickness.

It is therefore desirable to achieve reduction in size and thickness.

First, a display device according to an embodiment of the present technology includes: a display that is configured to allow an image to be displayed on a display screen; a back chassis disposed on an opposite surface side to the display screen of the display; and a support body disposed on a peripheral side of the display and the back chassis, wherein the support body includes a plate section, a first link section, and a second link section, the plate section being directed in a direction orthogonal to the display, the first link section being provided on one surface in a direction of thickness of the plate section, and the second link section being provided on the one surface in the direction of thickness of the plate section, a first member is attached to a periphery of the opposite surface to the display screen of the display, the first member being linked to the first link section, and a second member is attached to a periphery of the back chassis, the second member being linked to the second link section.

Therefore, in the display device according to the embodiment of the present technology, the first member attached to the display and the second member attached to the back chassis are linked to the first link section and the second link section, respectively, of the support body including the plate section that is directed in the direction orthogonal to the display.

Second, in the display device according to the embodiment of the present technology, it is desirable that the second member be made of a magnetic material, and a magnet be used as the second link section.

Since the second member is made of a magnetic material, and a magnet is used as the second link section, the second link section is attracted to the second member to allow them to be linked.

Third, in the display device according to the embodiment of the present technology, it is desirable that the first member be provided with a recess for link, and the first link section be formed as a projection that is configured to be inserted in and linked to the recess for link.

Since the first member is provided with the recess for link, and the first link section is formed as a projection that is configured to be inserted in and linked to the recess for link, insertion of the first link section in the recess for link allows the display to be supported by the support body.

Fourth, in the display device according to the embodiment of the present technology, it is desirable that a cushion be disposed between the plate section of the support body and a periphery of the display, the cushion being pressed onto the periphery of the display.

Since the cushion is disposed between the plate section of the support body and the periphery of the display, the cushion being pressed onto the periphery of the display, the display is protected by the cushion.

Fifth, in the display device according to the embodiment of the present technology, it is desirable that plate glass be used as the back chassis.

Since plate glass is used as the back chassis, high strength is secured even in a case that the back chassis is thin.

Sixth, in the display device according to the embodiment of the present technology, it is desirable that at least the plate section of the support body be made of aluminum.

Since at least the plate section of the support body is made of aluminum, reduction in weight is achieved while securing high strength of the support body.

Seventh, in the display device according to the embodiment of the present technology, it is desirable that there be provided: a light source unit including a light source that is configured to illuminate the display with back light; and a heat dissipation member that is configured to release heat generated in the light source unit, wherein the heat dissipation member be provided with a receiving projection part that is configured to receive the back chassis.

Since the light source unit and the heat dissipation member are provided, the light source unit including the light source and being configured to illuminate the display with back light, and the heat dissipation member being configured to release heat generated in the light source unit, wherein the heat dissipation member is provided with the receiving projection part that is configured to receive the back chassis, the heat dissipation member has both a function of releasing heat generated in the light source unit and a function of receiving a load of the back chassis.

Eighth, in the display device according to the embodiment of the present technology, it is desirable that an optical body be disposed between the display and the back chassis, the optical body including an optical sheet, wherein the second member be provided with an insertion space, and the optical body be slid with respect to the back chassis to allow a periphery of the optical body to be inserted in the insertion space, allowing the optical body to be disposed between the display and the back chassis.

Since the optical body is disposed between the display and the back chassis, the optical body including the optical sheet, wherein the second member is provided with the insertion space, and the optical body is slid with respect to the back chassis to allow the periphery of the optical body to be inserted in the insertion space, allowing the optical body to be disposed between the display and the back chassis, the optical body is disposed at a predetermined position without providing a dedicated member for positioning the optical body.

Ninth, in the display device according to the embodiment of the present technology, it is desirable that a bottom frame attached to the support body be provided, wherein the display be held by the bottom frame.

Since the bottom frame attached to the support body is provided, and the display is held by the bottom frame, the display is held by the bottom frame in a state in which the bottom frame is attached to the support body.

The display device according to the embodiment of the present technology includes: the display that is configured to allow an image to be displayed on the display screen; the back chassis disposed on the opposite surface side to the display screen of the display; and the support body disposed on the peripheral side of the display and the back chassis, wherein the support body includes the plate section, the first link section, and the second link section, the plate section being directed in the direction orthogonal to the display, the first link section being provided on the one surface in the direction of thickness of the plate section, and the second link section being provided on the one surface in the direction of thickness of the plate section, the first member is attached to the periphery of the opposite surface to the display screen of the display, the first member being linked to the first link section, and the second member is attached to the periphery of the back chassis, the second member being linked to the second link section.

Therefore, since the support body is provided with the plate section that is directed in the direction orthogonal to the display, it is possible to make an outer shape smaller, achieving reduction in size.

Moreover, since the display and the back chassis are supported, through the first member and the second member, by the support body including the first link section and the second link section that are provided on a same surface, it is possible to reduce a thickness of the display device, achieving reduction in thickness of the display device.

In the embodiment of the present technology, the second member is made of a magnetic material, and a magnet is used as the second link section.

Hence, it is possible to achieve simplification of a structure of the support body while making it possible to link the second member and the second link section easily and securely.

In the embodiment of the present technology, the first member is provided with the recess for link, and the first link section is formed as a projection that is configured to be inserted in and linked to the recess for link.

Therefore, insertion of the first link section in the recess for link allows the display to be supported by the support body, making it possible to achieve simplification of a structure of the display device and improvement of workability for a linking work of the display and the support body.

In the embodiment of the present technology, the cushion is disposed between the plate section of the support body and the periphery of the display, the cushion being pressed onto the periphery of the display.

Hence, it is possible to prevent the display from being damaged and to prevent dust from intruding in an inside of the display device through between the display and the support body.

In the embodiment of the present technology, plate glass is used as the back chassis.

Hence, it is possible to secure high strength even in a case that the back chassis is thin, achieving enhancement of strength and reduction in thickness of the display device.

In the embodiment of the present technology, at least the plate section of the support body is made of aluminum.

Hence, it is possible to achieve reduction in weight while securing high strength, leading to enhancement of strength and reduction in weight of the whole display device.

In the embodiment of the present technology, the light source unit and the heat dissipation member are provided, the light source unit including the light source and being configured to illuminate the display with back light, and the heat dissipation member being configured to release heat generated in the light source unit, wherein the heat dissipation member is provided with the receiving projection part that is configured to receive the back chassis.

Hence, the heat dissipation member has both a function of releasing heat generated in the light source unit and a function of receiving a load of the back chassis, making it possible to secure good heat dissipation performance and a stable condition of disposition of the back chassis as well as achieving reduction in thickness due to reduction in the number of components.

In the embodiment of the present technology, the optical body is disposed between the display and the back chassis, the optical body including the optical sheet, the second member is provided with the insertion space, and the optical body is slid with respect to the back chassis to allow the periphery of the optical body to be inserted in the insertion space, allowing the optical body to be disposed between the display and the back chassis.

Hence, the optical body is disposed at a predetermined position without providing a dedicated member for positioning the optical body, making it possible to achieve reduction in the number of components and enhancement of workability.

In the embodiment of the present technology, the bottom frame attached to the support body is provided, and the display is held by the bottom frame.

Hence, it is possible to dispose the display in a stable state.

BRIEF DESCRIPTION OF DRAWINGS

FIG. 1 illustrates, together with FIGS. 2 to 23, a display device according to an embodiment of the present technology, and is a perspective view of the display device.

FIG. 2 is an exploded perspective view of the display device.

FIG. 3 is a partial enlarged cross-sectional view.

FIG. 4 is an enlarged perspective view illustrating a state in which a first member is attached to a display.

FIG. 5 is a perspective view illustrating a state in which an attachment plate and a second member are attached to a back chassis.

FIG. 6 is an enlarged perspective view illustrating part of the second member in an attached state to the back chassis.

FIG. 7 is an exploded perspective view of a support body.

FIG. 8 is an enlarged cross-sectional view of the support body and a cushion.

FIG. 9A is an enlarged cross-sectional view illustrating a state before a first link section and a second link section are linked to a first member and the second member, respectively.

FIG. 9B is an enlarged cross-sectional view illustrating a state before the first link section and the second link section are linked to the first member and the second member, respectively.

FIG. 10 is an enlarged cross-sectional view illustrating a state in which the first link section and the second link section are linked to the first member and the second member, respectively.

FIG. 11 is a perspective view illustrating a state before an optical body is slid with respect to the second member.

FIG. 12 is a perspective view illustrating a state in which the optical body is slid with respect to the second member and is disposed on a front side of the back chassis.

FIG. 13 is an enlarged perspective view illustrating a state before the optical body is held by a holding member.

FIG. 14 is an enlarged perspective view illustrating a state in which the optical body is held by the holding member.

FIG. 15 is an enlarged cross-sectional view illustrating a state in which the optical body is held by the holding member.

FIG. 16 is a perspective view illustrating a state before a heat dissipation member is attached to the back chassis.

FIG. 17 is an enlarged perspective view illustrating a state in which the heat dissipation member is attached to the back chassis.

FIG. 18A is an enlarged perspective view illustrating a state before a middle chassis is attached to the heat dissipation member.

FIG. 18B is an enlarged perspective view illustrating a state before the middle chassis is attached to the heat dissipation member.

FIG. 19 is an enlarged perspective view illustrating a state in which the middle chassis is attached to the heat dissipation member.

FIG. 20 is an enlarged perspective view, seen in a different direction from that of FIG. 19, illustrating a state in which the middle chassis is attached to the heat dissipation member.

FIG. 21 is an enlarged perspective view illustrating a state in which a shield plate is attached to the heat dissipation member.

FIG. 22 is an enlarged perspective view illustrating a state before a bottom frame is attached to an attachment member.

FIG. 23 is an enlarged perspective view illustrating a state in which the bottom frame is attached to the attachment member.

BEST MODES FOR CARRYING OUT THE INVENTION

In the following, best modes for carrying out a display device according to an embodiment of the present technology will be described with reference to the attached drawings.

Best modes that will be described below involve application of the display device according to the embodiment of the present technology to a television receiver that is configured to allow an image to be displayed on a display.

It is to be noted that a range of application of the embodiment of the present technology is not limited to a television receiver, and the embodiment of the present technology has a wide range of application to various display devices such as monitors used in a personal computer and so forth.

[Configuration of Display Device]

A display device (a television receiver) 1 may be formed, for example, in a laterally long, flat, and substantially rectangular shape, and may include a display 2, a back chassis 3, and a support body 4 (refer to FIGS. 1 to 3). The display 2 is configured to allow an image to be displayed. The back chassis 3 is disposed behind the display 2. The support body 4 is disposed on a peripheral side of the display 2 and the back chassis 3.

The display 2 may be formed in a shape of a plate directed in a front-rear direction, and may be configured of, for example, glass plates 2a and 2b, a first polarization plate 2c, and a second polarization plate 2d. The glass plates 2a and 2b are front-rear joined. The first polarization plate 2c is bonded to a front surface of the glass plate 2a. The second polarization plate 2d is bonded to a rear surface of the glass plate 2b. The first polarization plate 2c may be one size smaller than the glass plate 2a and may be bonded to a portion other than a periphery of the glass plate 2a. The second polarization plate 2d may be one size smaller than the first polarization plate 2c and may be bonded to a portion other than a periphery of the glass plate 2b.

In the display 2, a region substantially corresponding to the second polarization plate 2d of a front surface of the display 2 may constitute a display screen 2e on which an image is displayed.

In the rear surface of the glass plate 2b of the display 2, first members 5, 5, . . . may be attached to an upper end, a right end and a left end at horizontally or vertically spaced positions (refer to FIG. 4). The first member 5 may be formed in a laterally-long or vertically-long shape and may be attached to the glass plate 2b by adhesion or the like. The first member 5 may be provided, in a center portion in a horizontal direction or in a vertical direction, with a recess 5a for link that penetrates vertically. Both of horizontal ends or both of vertical ends may be attached to the glass plate 2b.

The back chassis 3 may be, for example, made of glass and formed in a shape of a plate.

As mentioned above, since plate glass is used as the back chassis 3, high strength is secured even in a case that the back chassis 3 is thin, making it possible to achieving enhancement of strength and reduction in thickness of the display device 1.

In a portion on a lower side of the back chassis 3, shaft insertion holes 3a, 3a, . . . may be provided (refer to FIG. 2). To the portion on the lower side of the back chassis 3, a first attachment plate 6 and second attachment plates 7, 7 may be attached by adhesion or the like (refer to FIG. 5).

The first attachment plate 6 may be attached to a center portion in a horizontal direction of a front surface of the back chassis 3, and may be provided with screw shafts 6a, 6a, . . . . In the first attachment plate 6, the screw shafts 6a, 6a, . . . may be inserted in the shaft insertion holes 3a, 3a, . . . to protrude backward from the back chassis 3.

The second attachment plates 7, 7 may be attached to both on a right side and on a left side of the first attachment plate 6 on the back chassis 3, and may be provided with screw shafts 7a, 7a, . . . both in a right end and in a left end. In the second attachment plate 7, the screw shafts 7a, 7a, . . . may be inserted in the shaft insertion holes 3a, 3a, . . . to protrude backward from the back chassis 3.

To a periphery of the front surface of the back chassis 3, second members 8, 9, 9 may be attached by adhesion or the like (refer to FIGS. 5 and 6).

The second member 8 may be formed, for example, in a laterally-long shape obtained by bending a metal material having magnetism into a predetermined shape, and may have a horizontal length slightly shorter than a horizontal length of the back chassis 3. The second member 8 may be attached to an upper end of the back chassis 3.

The second member 8 may be configured of an attached surface section 10, a protruded surface section 11, and a terminal surface section 12. The attached surface section 10 is directed in the front-rear direction. The protruded surface section 11 is protruded forward from an upper end of the attached surface section 10. The terminal surface section 12 is protruded downward from a front end of the protruded surface section 11. In the second member 8, the attached surface section 10 may be attached to the back chassis 3. A space surrounded by the attached surface section 10, the protruded surface section 11, and the terminal surface section 12 may be formed as an insertion space 8a. The insertion space 8a may be opened downward and horizontally. The second member 8 may be provided, at positions over the protruded surface section 11 and the terminal surface section 12, with insertion arrangement holes 8b, 8b and attachment holes 8c, 8c, . . . at horizontally spaced positions, respectively.

The second members 9, 9 may be formed, for example, in a vertically-long shape obtained by bending a metal material into a predetermined shape, and may be attached to a right end and a left end of the back chassis 3, respectively. The second members 9, 9 may be attached to the back chassis 3 with an upper end positioned on a slightly lower side than a right end and a left end of the second member 8 and with a lower end protruded downward from a lower end of the back chassis 3.

The second member 9 may be configured of an attached surface section 13, a protruded surface section 14, and a terminal surface section 15. The attached surface section 13 is directed in the front-rear direction. The protruded surface section 14 is protruded forward from an outer end of the attached surface section 13. The terminal surface section 15 is protruded inward from a front end of the protruded surface section 14. In the second member 9, the attached surface section 13 may be attached to the back chassis 3. A space surrounded by the attached surface section 13, the protruded surface section 14, and the terminal surface section 15 may be formed as an insertion space 9a. The insertion space 9a may be opened inward and vertically. The second member 9 may be provided, at positions over the protruded surface section 14 and the terminal surface section 15, with insertion arrangement holes 9b, 9b at vertically spaced positions.

The support body 4 may include a support frame 16, and the support frame 16 may be made of, for example, a metal material such as aluminum (refer to FIG. 7). The support frame 16 may include a horizontal section 17 and vertical sections 18, 18. The horizontal section 17 extends horizontally. The vertical sections 18, 18 are protruded downward from a right end and a left end of the horizontal section 17, respectively, and extend vertically.

The horizontal section 17 may be configured of a plate section 17a and first link sections 17b, 17b, . . . . The plate section 17a is vertically directed. The first link sections 17b, 17b, . . . are protruded downward from a lower surface of the plate section 17a. The first link sections 17b, 17b, . . . may be formed in a shape of a plate that is directed in the front-rear direction, may be protruded downward from an intermediate portion in the front-rear direction of the plate section 17a, and may be provided at horizontally spaced positions.

The vertical section 18 may be configured of a plate section 18a and first link sections 18b, 18b, . . . . The plate section 18a is horizontally directed. The first link sections 18b, 18b, . . . are protruded inward (sideward) from an inner surface (a side surface) of the plate section 18a. A lower end of the vertical section 18 may be provided as an attachment projection part.

The support body 4 may be provided with second link sections 19, 20, 20 (refer to FIGS. 7 and 8). As the second link sections 19, 20, 20, for example, magnets may be used. The second link sections 19, 20, 20 may be attached to the plate sections 17a, 18a, 18a, respectively, by adhesion or the like.

The second link section 19 may be formed in a horizontally extending shape while the second link sections 20, 20 may be formed in a vertically extending shape. The second link sections 19, 20, 20 may be attached to a lower surface (an inner surface) of the plate section 17a, and surfaces facing each other (inner surfaces) of the plate sections 18a, 18a, respectively. Specifically, the second link section 19 may be positioned on a rear side of the first link sections 17b, 17b, . . . while the second link sections 20, 20 may be positioned on a rear side of the first link sections 18b, 18b, . . . .

The support body 4 may be provided with attachment piece sections 21, 21. The attachment piece sections 21, 21 are attached to respective attachment projection parts of the vertical sections 18, 18. The attachment piece sections 21, 21 may be protruded from the vertical sections 18, 18 in a direction in which the attachment piece sections 21, 21 become nearer to each other, and may be provided with screw holes 21a, 21a. The screw holes 21a, 21a penetrate vertically the attachment piece sections 21, 21.

To an inner surface of the support frame 16, a cushion 22 may be attached. The cushion 22 may be made of, for example, an ultraviolet curable resin material, and may be attached on a front side of the second link sections 19, 20, 20 by adhesion or the like.

With the support body 4 as configured above, as illustrated in FIGS. 9A, 9B, and 10, the first link sections 17b, 17b, . . . , 18b, 18b, . . . provided in the horizontal section 17 and the vertical sections 18, 18 of the support frame 16, respectively, are inserted from above or sideward into the recesses 5a, 5a, . . . for link of the first members 5, 5, . . . that are attached to the display 2, allowing the first link sections 17b, 17b, . . . , 18b, 18b, . . . and the first members 5, 5, . . . to be linked. The link of the first link sections 17b, 17b, . . . , 18b, 18b, . . . and the first members 5, 5, . . . allows the display 2 to be supported by the support body 4. It is to be noted that the first members 5, 5, . . . may be arranged by being inserted in the insertion arrangement holes 8b, 8b, . . . , 9b, 9b, . . . of the second members 8, 9, 9.

In a state in which the display 2 is supported by the support body 4, the cushion 22 attached to the inner surface of the support frame 16 is pressed to and adhered to the periphery of the display 2, allowing the display 2 to be protected by the cushion 22.

Accordingly, it is possible to prevent the display 2 from being damaged and to prevent dust from intruding into an inside of the display device 1 through between the display 2 and the support body 4.

Moreover, with the support body 4, the second link sections 19, 20, 20 that are attached to the horizontal section 17 of the support frame 16 are attracted, from an outer surface side, to the protruded surface sections 11, 14, 14 of the second members 8, 9, 9 that are attached to the back chassis 3, respectively. This allows the second link sections 19, 20, 20 and the second members 8, 9, 9 to be linked. The link of the second link sections 19, 20, 20 and the second members 8, 9, 9 allows the back chassis 3 to be supported by the support body 4.

As described above, in the support body 4, the support frame 16 is made of aluminum. Hence, it is possible to achieve reduction in weight as well as to secure high strength, making it possible to achieve enhancement of strength and reduction in weight of the whole display device 1.

Moreover, in the display device 1, the second members 8, 9, 9 are made of a magnetic material, and magnets are used as the second link sections 19, 20, 20 of the support body 4. It is therefore possible to achieve simplification of a structure of the support body 4 and to allow the second members 8, 9, 9 and the second link sections 19, 20, 20 to be linked easily and securely.

It is to be noted that description above has been given on an example in which the second members 8, 9, 9 are made of a magnetic material and magnets are used as the second link sections 19, 20, 20; however, the second members 8, 9, 9 are not limited to a magnetic material, nor the second link sections 19, 20, 20 are not limited to magnets. The second member and the second link section may have any structure capable of linking by, for example, fitting, engaging, adhesion, or the like. For example, a structure in which a projection part for link is inserted in a hole for link may be possible.

Moreover, also the first member and the first link section are not limited in structure, and may have any structure capable of linking by attraction using a magnet, or the like, as well as fitting, engaging, adhesion, or the like.

However, as described above, the first member 5 is provided with the recess 5a for link, and the first link sections 17b, 18b are formed as projections that are configured to be inserted in and linked to the recess 5a for link. Thus, the first link sections 17b, 18b are inserted in the recess 5a for link, allowing the display 2 to be supported by the support body 4. This makes it possible to achieve simplification of a structure of the display device 1 and improvement of workability for a linking work of the display 2 and the support body 4.

Between the display 2 and the back chassis 3, an optical body 23 may be disposed (refer to FIG. 3). The optical body 23 may be configured of various optical sheets, or the like, that are laminated in the front-rear direction. The optical body 23 may be configured of, for example, lamination of a reflective polarization sheet 23a, a prism sheet 23b, a diffusion sheet 23c, a light guide plate 23d, and a reflection sheet 23e in this order from a front side.

An upper end of the optical body 23 may be provided with attached pieces 24, 24, . . . at horizontally spaced positions. The attached pieces 24, 24, . . . are protruded upward. The attached pieces 24, 24, . . . may be provided with respective attached holes 24a, 24a, . . . (refer to FIG. 11).

The optical body 23 may be slid from below with respect to the back chassis 3 to allow a periphery of the optical body 23 to be inserted in the insertion space 8a, 9a, 9a of the second members 8, 9, 9 that are attached to the back chassis 3, and may be held by holding members 25, 25 . . ., allowing the optical body 23 to be disposed between the display 2 an the back chassis 3 (refer to FIGS. 11 and 12). At this occasion, the attached pieces 24, 24, . . . may be positioned at the respective attachment holes 8c, 8c, . . . that are formed in the second member 8.

The holding member 25 may be configured of a base section 25a, protruded sections 25b, 25b, and an insertion protruded section 25c (refer to FIGS. 13 to 15). The base section 25a extends horizontally. The protruded sections 25b, 25b are protruded backward from a right end and a left end of an upper end of the base section 25a, respectively. The insertion protruded section 25c is protruded backward from a lower end of a center portion in a horizontal direction of the base section 25a.

With the holding member 25, the insertion protruded section 25c is inserted from front in the attachment hole 8c of the second member 8, to allow the holding member 25 to be attached to the second member 8 in a state in which the protruded surface section 11 is held between the protruded sections 25b, 25b and the insertion protruded section 25c. In a state in which the holding members 25, 25, . . . are attached to the second member 8, the insertion protruded sections 25c, 25c, . . . are inserted in the attached holes 24a, 24a, . . . through the attachment holes 8c, 8c, . . . , respectively, allowing the attached pieces 24 to be pressed onto a front surface of the protruded surface section 11 by the base section 25a. Thus, the optical body 23 is held by the holding members 25, 25, . . . to be disposed between the display 2 and the back chassis 3. The optical body 23 has its lower end protruded slightly downward from the second members 9, 9.

As described above, the optical body 23 is slid with respect to the back chassis 3 to allow the periphery of the optical body 23 to be inserted in the insertion spaces 8a, 9a, 9a of the second members 8, 9, 9, allowing the optical body 23 to be disposed between the display 2 and the back chassis 3. Thus, the optical body 23 is disposed at a predetermined position in a state in which the optical body 23 is guided and positioned by the second members 8, 9, 9.

Accordingly, the optical body 23 is disposed at a predetermined position without providing a dedicated member for positioning the optical body 23, making it possible to achieve reduction in the number of components and enhancement of workability.

To a rear surface in a lower end of the back chassis 3, a heat dissipation member 26 may be attached by screwing or the like (refer to FIGS. 16 and 17). The heat dissipation member 26 may be made of a laterally-long metal material having a small thickness, and may include a heat dissipation surface section 27 and an arrangement surface section 28. The heat dissipation surface section 27 is directed in the front-rear direction except for a part thereof. The arrangement surface section 28 is protruded forward from a lower end of the heat dissipation surface section 27.

The heat dissipation surface section 27 may be provided with shaft insertion holes 27a, 27a, . . . at horizontally spaced positions. The heat dissipation surface section 27 may be provided, on both of a right end and a left end, with receiving projection parts 27b, 27b that are projected forward. The heat dissipation surface section 27 may be provided, at a position nearer to a lower end, a recess 27c for attachment that is opened downward and sideward.

In the arrangement surface section 28, both of a right end and a left end may be protruded sideward (outward) from the heat dissipation surface section 27. To an upper surface of the arrangement surface section 28, a light source unit 29 is attached. The light source unit 29 may include a laterally-long substrate 30 and light sources 31, 31, . . . that are mounted on the substrate 30. As the light source 31, for example, a light emitting diode (LED) may be used. The light sources 31, 31, . . . may be positioned directly below the light guide plate 23d in the optical body 23.

In both of the right end and the left end of the arrangement surface section 28, there may be formed an undepicted recess for positioning that is opened downward.

Light emitted from the light sources 31, 31, . . . is guided by the light guide plate 23d, is reflected by the reflection sheet 23e to be directed forward, and enters the display 2 as back light. At this occasion, heat generated in the light source unit 29 is released mainly from the heat dissipation surface section 27 of the heat dissipation member 26. Thus, an increase in temperature of the light source unit 29 is restrained.

To one end in a longitudinal direction of the substrate 30, a connector 32 may be connected. To the connector 32, an undepicted flexible printed circuit board may be connected, allowing the substrate 30 to be supplied with power through the connector 32 and the flexible printed circuit board.

To an upper surface in both of a right end and a left end of the substrate 30, spacers 33, 33 may be attached. Upper surfaces of the spacers 33, 33 may be positioned at a slightly higher level than upper surfaces of the light sources 31, 31, . . . .

With the heat dissipation member 26, the screw shafts 7a, 7a, . . . of the second attachment plate 7 that is attached to the back chassis 3 are inserted in the shaft insertion holes 27a, 27a, . . . of the heat dissipation surface section 27, to allow annular attachment screws 34, 34, . . . to be screwed with the screw shafts 7a, 7a, . . . . Thus, the heat dissipation member 26 is attached to the back chassis 3.

In a state in which the heat dissipation member 26 is attached to the back chassis 3, a lower surface of the back chassis 3 is in contact with the receiving projection parts 27b, 27b of the heat dissipation member 26, allowing the back chassis 3 to be received by the receiving projection parts 27b, 27b.

Accordingly, the heat dissipation member 26 has both a function of releasing heat generated in the light source unit 29 and a function of receiving a load of the back chassis 3. This makes it possible to secure good heat dissipation performance and a stable condition of disposition of the back chassis 3 as well as achieving reduction in thickness due to reduction in the number of components.

Moreover, in a state in which the heat dissipation member 26 is attached to the back chassis 3, lower surfaces in both of a right end and a left end of the optical body 23 are in contact with the spacers 33, 33, allowing the optical body 23 to be received by the spacers 33, 33. Hence, it is possible to prevent the optical body 23 from being in contact with the light sources 31, 31, . . . and to secure a stable condition of disposition of the optical body 23.

To the arrangement surface section 28 of the heat dissipation member 26, a middle chassis 35 may be attached (refer to FIGS. 18A, 18B to 20). The middle chassis 35 may be formed in a laterally-long shape, and may include a base surface section 36, a joint surface section 37 and a tiered surface section 38. The base surface section 36 is directed in the front-rear direction. The joint surface section 37 is protruded backward from a lower end of the base surface section 36. The tiered surface section 38 is provided on a front side of the base surface section 36.

In both of a right end and a left end of the joint surface section 37, there may be provided respective positioning pins 37a, 37a that are protruded upward. In both of the right end and the left end of the joint surface section 37, there may be provided notches 37b, 37b for arrangement that are opened sideward (outward) and in the front-rear direction.

An upper surface of the tiered surface section 38 may be positioned at a lower level than an upper surface of the base surface section 36. The upper surface of the tiered surface section 38 may be formed as a receiving surface 38a.

With the middle chassis 35, the positioning pins 37a, 37a are inserted in the respective recesses for positioning of the arrangement surface section 28, allowing the middle chassis 35 to be positioned. The middle chassis 35 is attached to the heat dissipation member 26 in a state in which the joint surface section 37 is in contact with the arrangement surface section 28.

In a state in which the middle chassis 35 is attached to the heat dissipation member 26, the base surface section 26 is positioned on a front side of a lower end of the optical body 23, and a lower surface of the display 2 is in contact with the receiving surface 38a, to allow the display 2 to be received by the receiving surface 38a.

To a rear surface in a lower end of the heat dissipation member 26, there may be mounted an undepicted drive circuit board. To the drive circuit board, an undepicted connection wiring board may be connected. The drive circuit board may be supplied with power through the connection wiring board, to allow the drive circuit board to perform display control on the display 2.

To the rear surface in the lower end of the heat dissipation member 26, there may be attached a shield plate 39 (refer to FIG. 21). The shield plate 39 covers the drive circuit board and the connection wiring board. The shield plate 39 may be formed in a laterally-long shape, and may include a box-shaped cover section 40 and an insertion section 41. The cover section 40 is opened forward. The insertion section 41 is protruded upward from a front edge of an upper end of the cover section 40.

In a lower surface in both of a right end and a left end of the cover section 40, there may be provided positioning pins 40a, 40a, . . . that each are protruded downward.

With the shield plate 39, the insertion section 41 is inserted from below in the recess 27c for attachment of the heat dissipation member 26, to allow the shield plate 39 to be attached to the heat dissipation member 26 in a state in which the cover section 40 covers the drive circuit board and the connection wiring board. By the shield plate 39, shielding of electromagnetic noises is performed with respect to the drive circuit board, the connection wiring board, and the substrate 30 of the optical unit 29.

In a state in which the shield plate 39 is attached to the heat dissipation member 26, the notches 37b, 37b for arrangement of the middle chassis 35 may be in an uncovered state by the shield plate 39. In the notches 37b, 37b for arrangement of the middle chassis 35, the attachment piece sections 21, 21 that are attached to the vertical sections 18, 18 of the support frame 16 may be arranged.

To the attachment piece sections 21, 21, a bottom frame 42 may be attached (refer to FIGS. 22 and 23). The bottom frame 42 may be formed in a laterally-long shape, and may include a front surface section 43 and a lower surface section 44. The front surface section 43 is directed in the front-rear direction. The lower surface section 44 is protruded backward from a lower end of the front surface section 43.

In both of a right end and a left end of the lower surface section 44, there may be formed respective screw insertion holes 44a, 44a. In both of the right end and the left end of the lower surface section 44, there may be formed respective positioning holes 44b, 44b, . . . . The positioning holes 44b, 44b, . . . may be positioned on a rear side of the screw insertion holes 44a, 44a.

With the bottom frame 42, the positioning pins 40a, 40a, . . . are inserted in the respective positioning holes 44b, 44b, . . . to allow positioning with respect to the shield plate 39 to be performed. Screw members 45, 45 are inserted in the respective screw insertion holes 44a, 44a to be screwed with the screw holes 21a, 21a of the attachment piece sections 21, 21, allowing the bottom frame 42 to be attached to the support body 4.

In a state in which the bottom frame 42 is attached to the support body 4, the middle chassis 35 and the shield plate 39 is held from below by the bottom frame 42. Thus, the stable conditions of dispositions of these members are secured. At the same time, the stable condition of disposition of the display 2 received by the receiving surface 38a of the middle chassis 35 is secured.

Moreover, in a state in which the bottom frame 42 is attached to the attachment piece sections 21, 21, the lower end of the display 2 is held from front by the bottom frame 42. Hence, it is possible to dispose the display 2 in a stable state.

To a lower end of the back chassis 3, a stand 46 may be attached (refer to FIG. 1). The stand 46 may include a stage section 46a and a leg section 46b that is protruded upward from the stage section 46a. The stand 46 may be attached to the back chassis 3 as follows. The screw shafts 6a, 6a, . . . of the first attachment plate 6 are inserted from front in undepicted shaft insertion holes formed in the leg section 46b. The attachment screws 34, 34, . . . are screwed with the screw shafts 6a, 6a, . . . .

On a rear surface side of the heat dissipation member 26 and the shield plate 39, a rear cover 47 may be attached by screwing or the like. By the rear cover 47, the heat dissipation member 26 and the shield plate 39 may be covered from behind.

SUMMARY

As described above, in the display device 1, the support body 4 is provided with the support frame 16, and the support frame 16 is provided with the plate sections 17a, 18a, 18a that are directed in a direction orthogonal to the display 2. Hence, it is possible to make an outer shape of the display device 1 smaller, achieving reduction in size.

Moreover, the first link sections 17b, 17b, . . . , 18b, 18b, . . . are provided in the inner surfaces of the plate sections 17a, 18a of the support frame 16. The second link sections 19, 20, 20 are provided in the inner surfaces of the plate sections 17a, 18a, 18a. The first link sections 17b, 17b, . . . , 18b, 18b, . . . are linked to the first members 5, 5, . . . that are attached to the display 2. The second link sections 19, 20, 20 are linked to the second members 8, 9, 9 that are attached to the back chassis 3.

Accordingly, the display 2 and the back chassis 3 are supported, through the first members 5, 5, . . . and the second members 8, 9, 9, by the support body 4 including the first link sections 17b, 17b, . . . , 18b, 18b, . . . and the second link sections 19, 20, 20 that are provided on a same surface of the support frame 16. It is therefore possible to reduce the thickness in the front-rear direction of the display device 1, achieving reduction in thickness of the display device 1.

[Present Technology]

The present technology may have the following configurations.

(1)

A display device including:

a display that is configured to allow an image to be displayed on a display screen;

a back chassis disposed on an opposite surface side to the display screen of the display; and a support body disposed on a peripheral side of the display and the back chassis, wherein the support body includes a plate section, a first link section, and a second link section, the plate section being directed in a direction perpendicular to the display, the first link section being provided on one surface in a direction of thickness of the plate section, and the second link section being provided on the one surface in the direction of thickness of the plate section, a first member is attached to a periphery of the opposite surface to the display screen of the display, the first member being linked to the first link section, and a second member is attached to a periphery of the back chassis, the second member being linked to the second link section.

(2)

The display device according to the above-described (1), wherein the second member is made of a magnetic material, and a magnet is used as the second link section.

(3)

The display device according to the above-described (1) or (2), wherein the first member is provided with a recess for link, and the first link section is formed as a projection that is configured to be inserted in and linked to the recess for link.

(4)

The display device according to any one of the above-described (1) to (3), including a cushion that is disposed between the plate section of the support body and a periphery of the display, the cushion being pressed onto the periphery of the display.

(5)

The display device according to any one of the above-described (1) to (4), wherein plate glass is used as the back chassis.

(6)

The display device according to any one of the above-described (1) to (5), wherein at least the plate section of the support body is made of aluminum.

(7)

The display device according to any one of the above-described (1) to (6), including:

a light source unit including a light source that is configured to illuminate the display with back light; and a heat dissipation member that is configured to release heat generated in the light source unit, wherein the heat dissipation member is provided with a receiving projection part that is configured to receive the back chassis.

(8)

The display device according to any one of the above-described (1) to (7), including an optical body between the display and the back chassis, the optical body including an optical sheet, wherein the second member is provided with an insertion space, and the optical body is slid with respect to the back chassis to allow a periphery of the optical body to be inserted in the insertion space, allowing the optical body to be disposed between the display and the back chassis.

(9)

The display device according to any one of the above-described (1) to (8), including a bottom frame attached to the support body, wherein the display is held by the bottom frame.

Specific shape and structure of each section that have been exemplified in the best modes for carrying out the above-described technology are merely an example of embodiment in carrying out the present technology, and the technical range of the present technology should not be interpreted in a limited manner by these.

This application claims the benefit of Japanese Priority Patent Application JP 2012-237863 filed on Oct. 29, 2012, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A display device comprising:
a display that is configured to allow an image to be displayed on a display screen;
a back chassis disposed on an opposite surface side to the display screen of the display; and
a support body disposed on a peripheral side of the display and the back chassis,
wherein the support body includes a plate section, a first link section, and a second link section, the plate section being directed in a direction orthogonal to the display and comprising a first surface and a second surface opposite the first surface in a direction of thickness of the plate section, the first link section being provided on the first surface of the plate section, and the second link section being provided on the first surface of the plate section,
a first member is attached to a periphery of the opposite surface to the display screen of the display, the first member being linked to the first link section, and
a second member is attached to a periphery of the back chassis, the second member being linked to the second link section
wherein the first member is provided with a recess for link, and
the first link section is formed as a projection that is configured to be inserted in and linked to the recess for link.

2. The display device according to claim 1,
wherein the second member is made of a magnetic material, and
a magnet is used as the second link section.

3. The display device according to claim 1, comprising a cushion that is disposed between the plate section of the support body and a periphery of the display, the cushion being pressed onto the periphery of the display.

4. The display device according to claim 1,
wherein plate glass is used as the back chassis.

5. The display device according to claim 1,
wherein at least the plate section of the support body is made of aluminum.

6. The display device according to claim 1, comprising:
a light source unit including a light source that is configured to illuminate the display with back light; and
a heat dissipation member that is configured to release heat generated in the light source unit,
wherein the heat dissipation member is provided with a receiving projection part that is configured to receive the back chassis.

7. The display device according to claim 1, comprising an optical body between the display and the back chassis, the optical body including an optical sheet,
wherein the second member is provided with an insertion space, and
the optical body is slid with respect to the back chassis to allow a periphery of the optical body to be inserted in the insertion space, allowing the optical body to be disposed between the display and the back chassis.

8. The display device according to claim 1, comprising a bottom frame attached to the support body,
wherein the display is held by the bottom frame.

9. A display device comprising:
a display that is configured to allow an image to be displayed on a display screen;
a back chassis disposed on an opposite surface side to the display screen of the display;
a support body disposed on a peripheral side of the display and the back chassis,
wherein the support body includes a plate section, a first link section, and a second link section, the plate section being directed in a direction orthogonal to the display and comprising a first surface and a second surface opposite the first surface in a direction of thickness of the plate section, the first link section being provided on the first surface of the plate section, and the second link section being provided on the first surface of the plate section,
a first member is attached to a periphery of the opposite surface to the display screen of the display, the first member being linked to the first link section, and
a second member is attached to a periphery of the back chassis, the second member being linked to the second link section; and
a cushion that is disposed between the plate section of the support body and a periphery of the display, the cushion being pressed onto the periphery of the display.

10. The display device according to claim 9,
wherein plate glass is used as the back chassis.

11. The display device according to claim 9,
wherein at least the plate section of the support body is made of aluminum.

12. The display device according to claim 9, comprising:
a light source unit including a light source that is configured to illuminate the display with back light; and
a heat dissipation member that is configured to release heat generated in the light source unit,
wherein the heat dissipation member is provided with a receiving projection part that is configured to receive the back chassis.

13. The display device according to claim 9, comprising an optical body between the display and the back chassis, the optical body including an optical sheet,
wherein the second member is provided with an insertion space, and
the optical body is slid with respect to the back chassis to allow a periphery of the optical body to be inserted in the insertion space, allowing the optical body to be disposed between the display and the back chassis.

14. The display device according to claim 9, comprising a bottom frame attached to the support body,
wherein the display is held by the bottom frame.

15. A display device comprising:
a display that is configured to allow an image to be displayed on a display screen;
a back chassis disposed on an opposite surface side to the display screen of the display;
a support body disposed on a peripheral side of the display and the back chassis,
wherein the support body includes a plate section, a first link section, and a second link section, the plate section being directed in a direction orthogonal to the display and comprising a first surface and a second surface opposite the first surface in a direction of thickness of the plate section, the first link section being provided on the first surface of the plate section, and the second link section being provided on the first surface of the plate section,
a first member is attached to a periphery of the opposite surface to the display screen of the display, the first member being linked to the first link section, and
a second member is attached to a periphery of the back chassis, the second member being linked to the second link section;
a light source unit including a light source that is configured to illuminate the display with back light; and
a heat dissipation member that is configured to release heat generated in the light source unit,
wherein the heat dissipation member is provided with a receiving projection part that is configured to receive the back chassis.

16. The display device according to claim 15, wherein plate glass is used as the back chassis.

17. The display device according to claim 15, wherein at least the plate section of the support body is made of aluminum.

18. The display device according to claim 15, comprising an optical body between the display and the back chassis, the optical body including an optical sheet,
wherein the second member is provided with an insertion space, and
the optical body is slid with respect to the back chassis to allow a periphery of the optical body to be inserted in the insertion space, allowing the optical body to be disposed between the display and the back chassis.

19. The display device according to claim 15, comprising a bottom frame attached to the support body,
wherein the display is held by the bottom frame.

20. A display device comprising:
a display that is configured to allow an image to be displayed on a display screen;
a back chassis disposed on an opposite surface side to the display screen of the display;
a support body disposed on a peripheral side of the display and the back chassis,
wherein the support body includes a plate section, a first link section, and a second link section, the plate section being directed in a direction orthogonal to the display and comprising a first surface and a second surface opposite the first surface in a direction of thickness of the plate section, the first link section being provided on the first surface of the plate section, and the second link section being provided on the first surface of the plate section,
a first member is attached to a periphery of the opposite surface to the display screen of the display, the first member being linked to the first link section, and
a second member is attached to a periphery of the back chassis, the second member being linked to the second link section; and
an optical body between the display and the back chassis, the optical body including an optical sheet,
wherein the second member is provided with an insertion space, and
the optical body is slid with respect to the back chassis to allow a periphery of the optical body to be inserted in the insertion space, allowing the optical body to be disposed between the display and the back chassis.

21. The display device according to claim 20, wherein plate glass is used as the back chassis.

22. The display device according to claim 20, wherein at least the plate section of the support body is made of aluminum.

23. The display device according to claim 20, comprising:
a light source unit including a light source that is configured to illuminate the display with back light; and
a heat dissipation member that is configured to release heat generated in the light source unit,
wherein the heat dissipation member is provided with a receiving projection part that is configured to receive the back chassis.

24. The display device according to claim 20, comprising a bottom frame attached to the support body,
wherein the display is held by the bottom frame.

* * * * *